United States Patent
Inoue

(10) Patent No.: US 6,720,500 B1
(45) Date of Patent: Apr. 13, 2004

(54) PLUG-IN TYPE ELECTRONIC CONTROL UNIT, STRUCTURE OF CONNECTION OF WIRING BOARD WITH PLUG MEMBER, UNIT OF CONNECTION OF ELECTRONIC PART WITH WIRING BOARD, AND PROCESS FOR MOUNTING ELECTRONIC PART

(75) Inventor: Masajiro Inoue, Saitama (JP)

(73) Assignee: Honda Giken Kogyo Kabushiki Kaisha, Tokyo (JP)

(*) Notice: Subject to any disclaimer, the term of this patent is extended or adjusted under 35 U.S.C. 154(b) by 0 days.

(21) Appl. No.: 09/042,989

(22) PCT Filed: Jul. 22, 1997

(86) PCT No.: PCT/JP97/02518
§ 371 (c)(1),
(2), (4) Date: Mar. 3, 1999

(87) PCT Pub. No.: WO98/04000
PCT Pub. Date: Jan. 29, 1998

(30) Foreign Application Priority Data

Jul. 22, 1996 (JP) .............................................. 8-192119
Jul. 22, 1996 (JP) .............................................. 8-192120
Jun. 6, 1997 (JP) .............................................. 5-148984

(51) Int. Cl.[7] ........................ H05K 7/10; H01L 23/48; H01R 13/04; H01R 13/10
(52) U.S. Cl. ........................ 174/258; 174/259; 174/260; 174/264; 174/267; 257/697; 257/698; 257/778; 439/86; 439/876; 29/832; 29/842; 438/108; 438/118; 438/119; 438/125
(58) Field of Search .................................. 174/260, 262, 174/267, 258, 259, 264; 439/83, 86, 876; 361/768, 771, 783; 257/698, 778, 697; 29/837, 840–843, 832; 438/108, 118, 119, 125

(56) References Cited

U.S. PATENT DOCUMENTS 4,373,778 A  2/1983  Adham ........................ 385/89

(List continued on next page.)

FOREIGN PATENT DOCUMENTS

| DE | 32 37 356 | | 4/1984 | |
|---|---|---|---|---|
| GB | 2 287 364 | | 9/1995 | |
| GB | 2 293 502 | | 3/1996 | |
| JP | 57-166051 A | * | 10/1982 | .......... H01L/23/12 |
| JP | 61-049443 | * | 3/1986 | .......... H01L/21/48 |
| JP | 02-137357 A | * | 5/1990 | .......... H01L/23/02 |
| JP | 02-503494 A | * | 10/1990 | .......... H01L/25/16 |
| JP | 03-283378 A | * | 12/1991 | .......... H01R/43/00 |
| JP | 04-164359 A | * | 6/1992 | .......... H01L/23/50 |
| JP | 05-006920 A | * | 1/1993 | .......... H01L/21/60 |
| JP | 06-333984 A | * | 12/1994 | .......... H01L/21/60 |
| WO | WO-93/07659 | | 4/1993 | |

OTHER PUBLICATIONS

Search Report Dec. 22, 1992.

Search Report (PCT/JP97/02518)—Int'l Search Report Nov. 5, 1997.

Supplementary European Serach Report—Mar. 6, 2000.

*Primary Examiner*—John B. Vigushin

(57) ABSTRACT

A plug-in type electronic control unit is comprised of a wiring board, a plurality of electronic parts mounted on one surface of the wiring board by utilizing a wireless bonding process, and a plug member mounted on the other surface of the wiring board by utilizing a wireless bonding process. It is possible to suppress the planar extent of the unit by such a laminated structure, and to suppress the extent of the unit in a laminating direction by the employment of the wireless bonding process. Thus, it is possible to achieve a reduction in size of the plug-in type electronic control unit.

13 Claims, 30 Drawing Sheets

U.S. PATENT DOCUMENTS

| | | | | |
|---|---|---|---|---|
| 4,770,641 A | * | 9/1988 | Rowlette | 439/86 |
| 5,255,431 A | * | 10/1993 | Burdick | 29/840 |
| 5,276,289 A | * | 1/1994 | Satoh et al. | 174/260 |
| 5,279,711 A | * | 1/1994 | Frankeny et al. | 174/263 |
| 5,313,021 A | * | 5/1994 | Sajja et al. | 174/260 |
| 5,367,765 A | * | 11/1994 | Kusaka | 29/840 |
| 5,373,110 A | * | 12/1994 | Inasaka | 174/267 |
| 5,407,864 A | * | 4/1995 | Kim | 29/834 |
| 5,768,109 A | * | 6/1998 | Gulick et al. | 361/794 |
| 5,796,590 A | * | 8/1998 | Klein | 361/774 |
| 5,848,466 A | * | 12/1998 | Viza et al. | 29/840 |
| 5,859,470 A | * | 1/1999 | Ellerson et al. | 257/772 |
| 6,022,761 A | * | 2/2000 | Grupen-Shemansky et al. | 438/125 |

* cited by examiner

PLUG-IN TYPE ELECTRONIC CONTROL UNIT, STRUCTURE OF CONNECTION OF WIRING BOARD WITH PLUG MEMBER, UNIT OF CONNECTION OF ELECTRONIC PART WITH WIRING BOARD, AND PROCESS FOR MOUNTING ELECTRONIC PART

FIELD OF THE INVENTION

The present invention relates to a plug-in type electronic control unit used for controlling various mechanical systems, as well as a structure of connection of a wiring board with a plug member, a unit of connection of the electronic part with the wiring board, and a process for mounting the electronic part, which are technically associated with the plug-in type electronic control unit.

BACKGROUND ART

There is a conventionally known plug-in type electronic control unit of the above-described type, which includes a wiring board accommodated in a case, a plurality of electronic parts mounted to the wiring board and also accommodated in the case, and plug members integrally provided on opposite sides of the case. In this case, connecting areas are provided in the wiring board on opposite sides of each of electronic part-mounted areas, and a plurality of connecting terminals existing in each of the connecting areas and a plurality of pin-shaped contacts of each plug member are electrically connected to each other by utilizing a wire bonding process.

If the plug-in type electronic control unit is constructed in the above manner, however, the following problem is encountered: The size of the wiring board is increased, and since the plug members are disposed on the opposite sides of the wiring board, the size of the entire electronic control unit is increased.

There is a conventionally known unit of connection of an electronic part with a wiring board, which includes an electronic part provided with at least one electrode having a projection (bump) formed by application of a wire bonding process, an electrically insulating wiring board having at least one connecting terminal opposed to the projection, a conductive bonding material such as a solder or the like which electrically bonds the projection and the connecting terminal to each other, and an electrically insulating sealing agent penetrated into a gap between the electronic part and the wiring board by a capillary phenomenon to bond the electronic part and the wiring board to each other.

The sealing agent is used to electrically insulate a connection comprised of the projection of the electrode, the connecting terminal and the conductive bonding material from the surroundings and to moderate the thermal stress acting on the connection due to a difference in linear expansion coefficient between the electronic part and the wiring board in the course of cooling after the electronic part has operated.

In the conventional connection unit, however, the gap between the electronic part and the wiring board is extremely narrow, and the volume of the sealing agent is very small. Therefore, when a thermal stress is applied to the connection due to the difference in linear expansion coefficient between the electronic part and the wiring board in the course of cooling after operation of the electronic part, the following problem is encountered: the thermal stress cannot be sufficiently moderated and as a result, there is a possibility that the connection may be broken.

Further, there is a conventionally known process for mounting an electronic part, which includes forming a projection (bump) on an electrode of an electronic part by utilizing a wire bonding technique in correspondence to the connection unit, electrically connecting the projection with a connecting terminal of a wiring board using a conductive bonding material such as a solder or the like, and then allowing a liquid-state electrically insulating sealing agent to be penetrated into a gap between the electronic part and the wiring board by a capillary phenomenon, thereby bonding the electronic part and the wiring board to each other.

With the conventional process, however, the connection of the projection of the electrode with the connecting terminal and the application of the sealing agent to the connection are carried out at separate steps, resulting in problems of a bad workability and an increased mounting cost.

DISCLOSURE OF THE INVENTION

Accordingly, it is an object of the present invention to provide a plug-in type electronic control unit of the above-described type, a reduction in size of which is realized by utilizing a surface of the wiring board opposite from the electronic part-mounted surface as a plug member-mounted surface and by employing a particular electrically connecting system.

To achieve the above object, according to the present invention, there is provided a plug-in type electronic control unit comprising a wiring board, a plurality of electronic parts mounted on one of opposite surfaces of the wiring board by utilizing a wireless bonding process, and a plug member mounted on the other surface of the wiring board by utilizing a wireless bonding process.

If the plurality of electronic parts, the wiring board and the plug member are constructed in a laminated structure as described above, the planar extent of the electronic control unit can be remarkably suppressed as compared with the conventional electronic control unit. In addition, if the wireless bonding process, namely, a connecting process using no wire, is employed to mount the electronic parts and the plug member, the planar extent of the electronic control unit in a laminating direction can be remarkably suppressed. In this manner, it is possible to realize a reduction in size of the plug-in type electronic control unit.

It is another object of the present invention to provide a structure of connection of a wiring board with a plug member, wherein the thermal stress acting on a connection between a connecting terminal of the wiring board and a pin-shaped contact of the plug member can be sufficiently moderated.

To achieve the above object, according to the present invention, there is provided a structure of connection of a wiring board with a plug member, comprising a wiring board having an electronic part mounted on one of opposite surfaces thereof and a connecting terminal on the other surface thereof, a plug member including a pin-shaped contact opposed to the connecting terminal, a conductive bonding material which electrically connects the connecting terminal and the pin-shaped contact to each other, and an electric insulator which surrounds the conductive bonding material and is sandwiched between the wiring board and the plug member.

In this connection structure, it is possible to increase the volume of the electric insulator existing between the wiring board and the plug member, thereby sufficiently moderating the thermal stress acting on the connection due to the difference in linear expansion coefficient between the wiring board and the plug member in the course of cooling after of the electronic part has operated.

It is a further object of the present invention to provide a unit of connection of the electronic part with the wiring board, wherein a thermal stress acting on a connection comprised of a projection of the electrode, a connection terminal and a conductive bonding material can be moderated sufficiently.

To achieve the above object, according to the present invention, there is provided a unit of connection of an electronic part with a wiring board, comprising an electronic part provided with at least one electrode having a projection, a wiring board including at least one connecting terminal opposed to the projection, a conductive bonding material which electrically connects the projection and the connecting terminal to each other, and an electrically insulating sealing agent which surrounds the conductive bonding material and bonds the electronic part and the wiring board to each other, the relationship between a diameter a of the projection and a thickness b of the sealing agent existing between the electronic part and the wiring board being set at b>a, and a distance between a tip end of the projection and the connecting terminal being set in a range of c>0.02 mm.

In the connection unit of the above-described arrangement, the volume of the sealing agent existing between the electronic part and the wiring board is large, and the distance c is large. Therefore, a thermal stress acting on the connection due to a difference in linear expansion coefficient between the electronic part and the wiring board in the course of cooling after operation of the electronic part can be moderated sufficiently.

This is because, although a lateral shearing force is applied to the sealing agent existing between the electronic part and the wiring board substantially in parallel to the opposed surfaces of the electronic part and the wiring board due to the difference in linear expansion coefficient, the shearing force per unit volume acting on the sealing agent can be decreased when the volume of the sealing agent is large as described above, and in addition, the connection sufficiently withstands such shearing force because of the large distance c. Thus, the connection unit has an excellent thermal shock resistance.

It is a yet further object of the present invention to provide a process for mounting the electronic part, which is capable of producing a connection unit, wherein the operability of mounting of the electronic part can be improved to reduce the mounting cost, and a thermal stress acting on the connection can be moderated sufficiently.

To achieve the above object, according to the present invention, there is provided a process for mounting an electronic part having at least one electrode onto a heat resistant and electrically insulating wiring board having at least one connecting terminal, while connecting the electrode electrically to the connecting terminal, the process comprising the steps of bringing an electrically insulating skin film-shaped sealing agent into close contact with the wiring board, filling a conductive bonding material into at least one connecting bore in the skin film-shaped sealing agent which corresponds to the connecting terminal, and bonding the electronic part to the wiring board through the skin film-shaped sealing agent in a state in which a projection of the electrode of the electronic part has been put into the conductive bonding material in the connecting bore.

In the above process, the connecting operation of the projection of the electrode with the connecting terminal and the application of the sealing agent to a connection comprised of the projection, the connecting terminal and the conductive bonding material are performed at the same step. Therefore, the operability of mounting the electronic part can be improved to reduce the mounting cost.

In addition, since the skin film-shaped sealing agent is interposed between the electronic part and the wiring board, the volume of the sealing agent existing between the electronic part and the wiring board can be increased in the connection unit. Thus, it is possible to sufficiently moderate the thermal stress acting on the connection due to a difference in linear expansion coefficient between the electronic part and the wiring board in the course of cooling after the electronic part has operated.

This is because, although a lateral shearing force acts on the sealing agent between the electronic part and the wiring board substantially in parallel to the opposed surfaces of the electronic part and the wiring board due to the difference in linear expansion coefficient, in the case where the sealing agent has a large volume as described above, the shearing force per unit volume acting on the sealing agent can be reduced. Thus, the connection unit has an excellent thermal shock resistance.

BEST MODE FOR CARRYING OUT THE INVENTION

A. Plug-in Type Electronic Control Unit

EXAMPLE I

Figure 1:
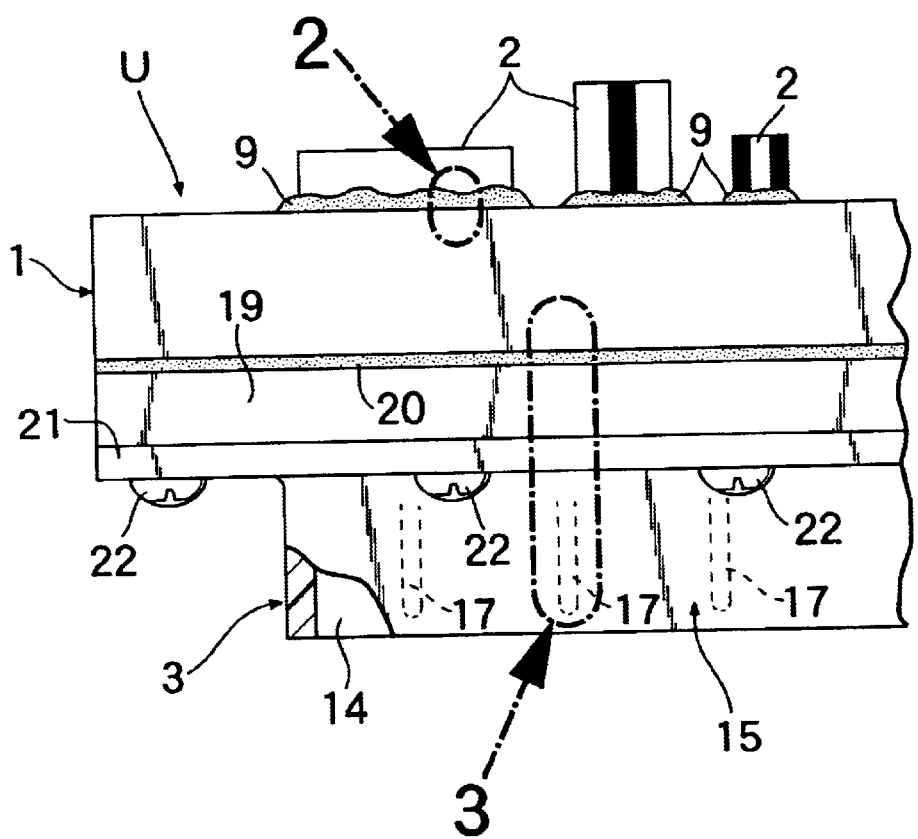
FIG. 1 is a partially cutaway front view of an essential portion of a plug-in type electronic control unit.
Figure 2:
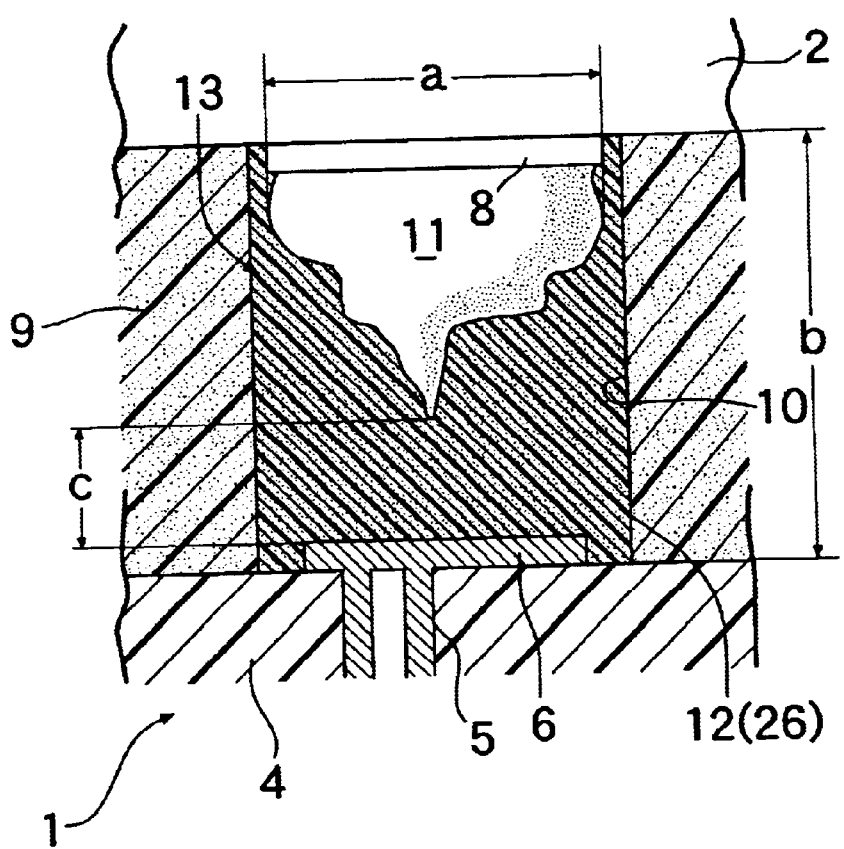
FIG. 2 is an enlarged sectional view of a portion indicated by an arrow 2 in FIG. 1.
Figure 3:
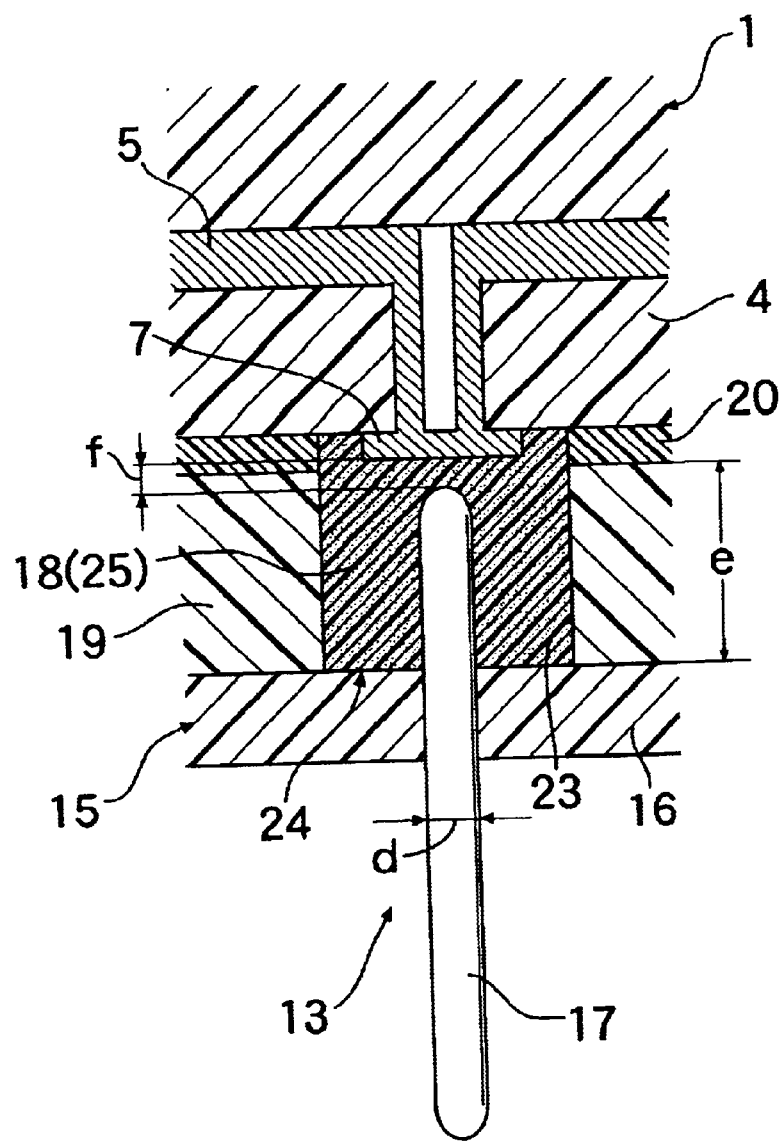
FIG. 3 is an enlarged sectional view of a portion indicated by an arrow 3 in FIG. 1.

Referring to FIGS. 1 to 3, a plug-in type electronic control unit U is comprised of a wiring board 1, a plurality of electronic parts 2 mounted on one side of the wiring board 1 by utilizing a wireless bonding process, and a plug member 3 mounted on the other side of the wiring board 1 by utilizing a wireless bonding process.

If the plurality of electronic parts 2, the wiring board 1 and the plug member 3 are assembled into a laminated structure as described above, the planar extent of the plug-in type electronic control unit U can be substantially suppressed as compared with the prior art. If the wireless bonding process, namely, a connecting process using no wire is employed to mount the electronic parts 2 and the plug member 3, the extent of the plug-in type electronic control unit U in a laminating direction can be substantially suppressed. In this manner, it is possible to realize a reduction in size of the plug-in type electronic control unit U.

The wiring board 1 is comprised of an electrically insulating plate-shaped body 4, and a conductor 5 retained within the body 4. A plurality of connecting terminals 6 and 7 forming portions of the conductor 5 are respectively exposed to opposite surfaces of the body 4.

The electronic parts 2 include FC (a flip chip) which is a semiconductor bearing chip including an unsealed semiconductor, CSP (a chip-size package) which is a high-density package, BGA (a ball grid array) and the like.

As best shown in FIG. 2, the electronic part 2 has at least one electrode 8, e.g., a plurality of electrodes 8 (in the illustrated embodiment) on its surface opposed to each of the wiring board 1. The wiring board 1 has at least one connecting terminal 6, e.g., the same number (in the illustrated embodiment) of connecting terminals 6 as the number of the electrodes 8 on its surface opposed to the electronic part 2. The electronic part 2 and the wiring board 1 are bonded to each other through an electrically insulating sealing agent 9 cured under heating and pressurizing conditions, so that each electrode 8 of the electronic part 2 and each connecting terminal 6 of the wiring board 1 are opposed to each other within each connecting bore 10 in the sealing agent 9. Each of the electrodes 8 has a projection (bump) 11 made of gold. The projection 11 is formed utilizing a wire bonding technique and has a given diameter $a$. The inside of each connecting bore 10 is filled with a conductive bonding material 12 cured under heating and pressurizing conditions and therefore, each conductive bonding material 12 is surrounded by the sealing agent 9. In this manner, the projection 11 of each electrode 8 and each connecting terminal 6 are electrically connected to each other through the conductive bonding material 12. These electrode 8, projection 11, connecting terminal 6 and conductive bonding material 12 constitute a connection 13.

The relationship between the diameter $a$ of the projection 11 of each electrode 8 and the thickness $b$ of the sealing agent 9 between the electric part 2 and the wiring board 1 is set at $b>a$, and the distance $c$ between a tip end of the projection 11 and the connecting terminal 6 is set at $c>0.02$ mm.

If the construction is such as described above, the volume of the sealing agent 9 existing between the electronic part 2 and the wiring board 1 is larger and the distance $c$ is wider. Therefore, in the cooling course after operation of the electronic part 2, the thermal stress acting on the connection 13 due to a difference in linear expansion coefficient between the electronic part 2 and the wiring board 1 can be sufficiently moderated.

This is because a lateral shearing force acts on the sealing agent 9 between the electronic part 2 and the wiring board 1 substantially in parallel to the opposed surfaces of the electronic part 2 and the wiring board 1 due to the difference in linear expansion coefficient, but in the case where the sealing agent 9 has the larger volume as described above, the shearing force per unit volume on the sealing agent 9 can be reduced, and the connection 13 sufficient withstands the shearing force, because of the wider distance $c$. Thus, the structure of connection of the wiring board 1 with the electronic parts 2 has an excellent resistance to a thermal shock.

The plug member 3 includes a box 15 made of a synthetic resin and having an insertion bore 14, and a plurality of pin-shaped contacts 17 retained in a bottom wall 16 of the box 15 to pass therethrough. One end of each of the pin-shaped contacts 17 is opposed to each of the connecting terminals 7 of the wiring board 1, and the connecting terminal 7 and the pin-shaped contact 17 are electrically interconnected by a conductive bonding material 18.

The conductive bonding material 18 is surrounded by an electric insulator 19 which is sandwiched between the wiring board 1 and the plug member 3.

In the illustrated embodiment, the electric insulator 19 is of a sheet-shaped shape and is bonded to the wiring board 1 through an electric insulating adhesive 20. The plug member 3 is fixed to the wiring board 1 by threadedly inserting a plurality of screws 22 passed through a flange portion 21 integral with the box 15 and the electric insulator 19 into the wiring board 1.

The electric insulator 19 has a plurality of connecting bores 23 in correspondence with the plurality of connecting terminals 7 and the plurality of pin-shaped contacts 17, and each connecting terminal 7, each pin-shaped contact 17 and the conductive bonding material 18 are located within corresponding one of the connecting bores 23. Therefore, the connecting terminal 7, the pin-shaped contact 17 and the conductive bonding material 18 constitute a connection 24.

In this case, the relationship between the diameter $d$ of the pin-shaped contact 17 and the thickness $e$ of the electric insulator 19 is set at $e>d$, and the distance $f$ between the pin-shaped contact 17 and the connecting terminal 7 is set at $f>0.02$ mm.

If the construction is such as described above, the volume of the electric insulator 19 existing between the wiring board 1 and the box 15 of the plug member 3 is larger and the distance $f$ is wider. Therefore, in the cooling course after operation of the electronic part 2, the thermal stress acting on the connection 24 due to a difference in linear expansion coefficient between the wiring board 1 and the box 15 can be sufficiently moderated.

The wiring board 1 which may be used is IVH (Interstitial Via Hole) 4-layer substrate, and the electrically insulating plate-shaped body 4 of the wiring board 1 is formed of a composite material made of a glass fabric and a bis-maleimide triazine resin.

In the structure of connection of the electronic parts 2 with the wiring board 1, the sealing agent 9 is formed of a novolak-based epoxy resin containing a silica-based filler and is used in the form of a skin film. This resin is solid at ambient temperature, but if heated, it is sequentially softened, molten and cured. The gelling time for this resin is 120 seconds at 150° C., but the time as long as 20 minutes at 150° C. is required to cure this resin completely.

The conductive bonding material 12 is formed of 75% by weight of an irregular silver powder smaller than 300 meshes and 25% by weight of an aliphatic hydrocarbonic epoxy resin. The conductive bonding material 12 is used in the form of a paste. The conductive paste is formed of the conductive bonding material 12 and 45.8% by volume of a solvent mixture. The solvent mixture is formed by mixing 70% by weight of xylene and 30% by weight of ethanol. This paste is referred to as a first conductive paste.

The aliphatic hydrocarbonic epoxy resin is liquid at ambient temperature, but if heated, it is cured. The gelling time for this resin is in a range of 90 to 100 seconds at 150° C. and shorter than that for the novolak-based epoxy resin. In this case, the solvent mixture is substantially completely volatilized in about 60 seconds at 150° C.

If the gelling time for the conductive bonding material 12 is shorter than the gelling time for the sealing agent 9 as described above, the confinement of air bubbles in the conductive bonding material 12, which occurs when the sealing agent 9 is gelled earlier than the conductive bonding material 12, can be prevented, thereby avoiding a failure of connection of the projection 11 of each electrode 8 with each connecting terminal 6.

After cured, the conductive bonding material 12 has a softness, and the hardness thereof is lower than that of the sealing agent 9. This is effective to moderate the thermal stress and to prevent the deformation and breakage of each connection 13 due to a vibration.

In the structure of connection of the wiring board 1 with the plug member 3, the electric insulator 19 is formed of a composite similar to that for forming the wiring board 1 and is used in the form of a sheet.

The conductive bonding material 18 is formed of 75% by weight of an irregular silver powder smaller than 300 meshes and 25% by weight of a one liquid type thermal curing epoxy resin. The conductive bonding material 18 is used in the form of a paste. The conductive paste is formed of the conductive bonding material 18 and 29.2% by volume of a solvent. This paste is referred to as a second conductive paste.

The conductive bonding material 18, in a cured state, has a softness, and the hardness thereof is lower than that of the electric insulator 19. This is effective to moderate the thermal stress and to prevent the deformation and breakage of each connection 24 due to a vibration. Further, a solder may be used as the conductive material 18.

The box 15 of the plug member 3 is formed of polyphenylene sulfide (PPS) containing 30% by weight of an inorganic filler.

A process for producing the electronic control unit U will now be described.

Figure 4:
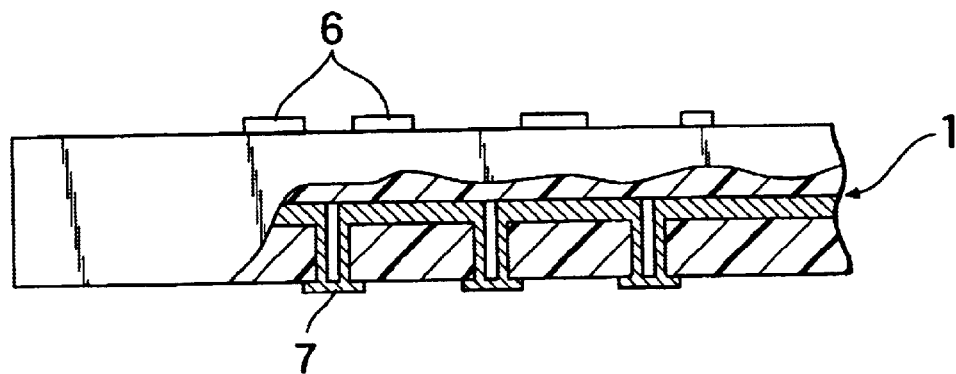
FIG. 4 is a partially cutaway front view of an essential portion of a wiring board.

(1) As shown in FIG. 4, a wiring board 1 having a plurality of connecting terminals 6 and 7 on its top and bottom surfaces was prepared.

Figure 5:
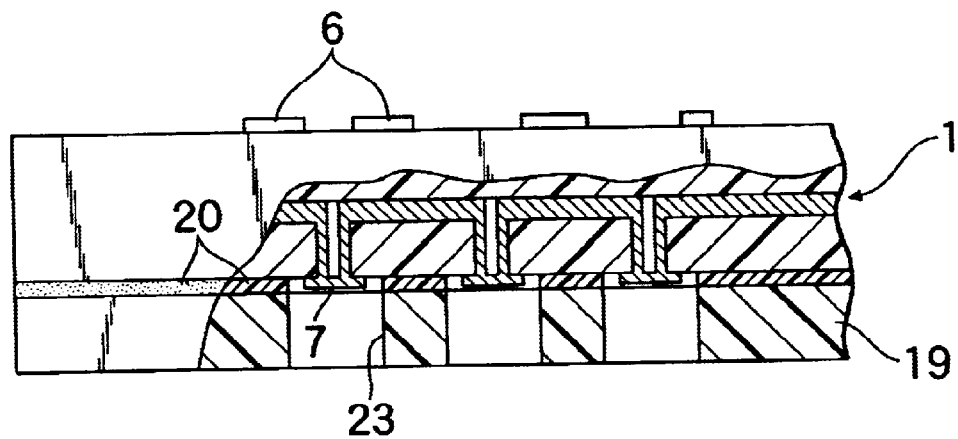
FIG. 5 is a partially cutaway front view of an essential portion, showing a state in which an electric insulator has been bonded to the wiring board.

(2) As shown in FIG. 5, a sheet-shaped electric insulator 19 with a thickness of 1.6 mm having a plurality of connecting bores 23 with a diameter of 1.5 mm was bonded by pressing to the bottom surface of the wiring board 7 through an electric insulating adhesive 20, and each connecting terminal 7 was located within corresponding one of the connecting bores 23.

Figure 6:
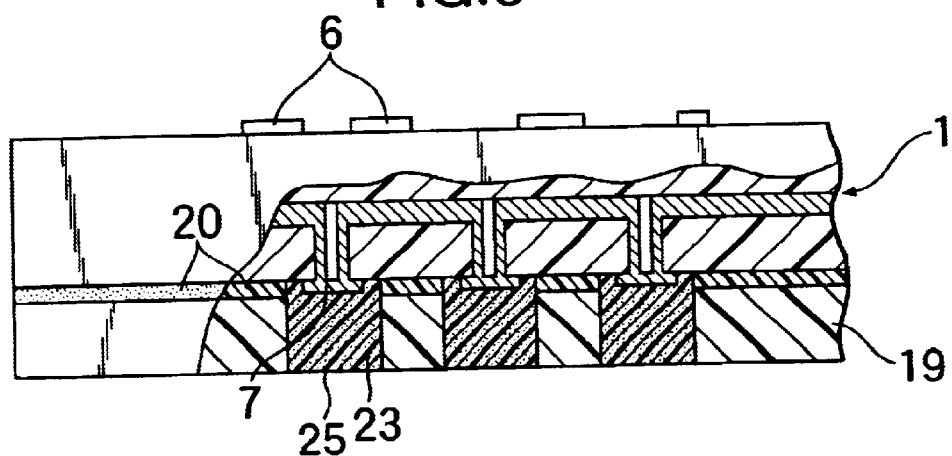
FIG. 6 is a partially cutaway front view of an essential portion, showing a state in which a second conductive paste has been filled into each of connecting bores in the electric insulator.

(3) As shown in FIG. 6, using the second conductive paste 25 having the above-described composition, a metal mask screen printing was applied to the surface of the electric insulator 19 to fill the second conductive paste 25 into each of the connecting bores 23.

Figure 7:
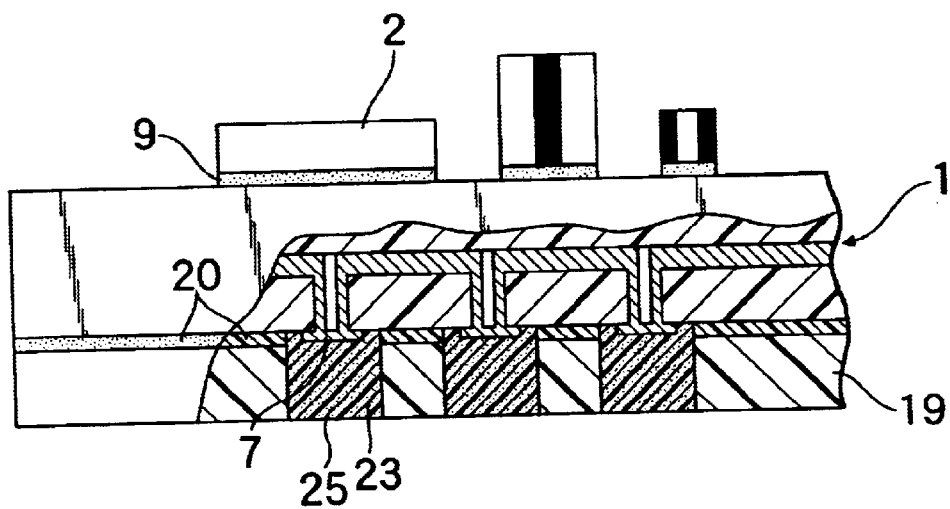
FIG. 7 is a partially cutaway front view of an essential portion, showing a state in which an electronic part has been mounted onto the wiring board.

(4) As shown in FIG. 7, a plurality of electronic parts 2 were mounted on the top surface of the wiring board 1. This mounting was carried out in a procedure shown in FIGS. 8A to 8C.

Figure 8A:
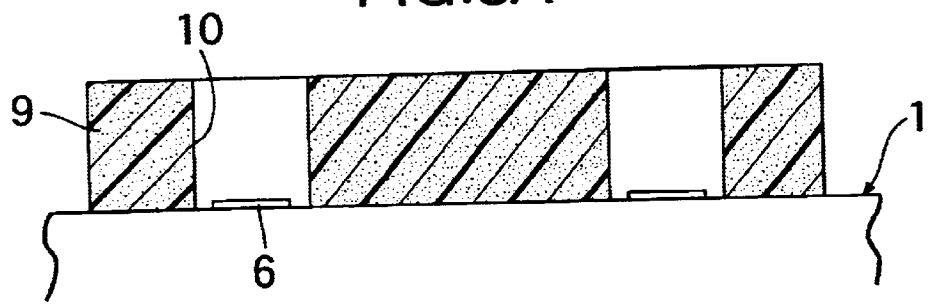
FIG. 8A is a partially broken-away front view of an essential portion, showing a state in which a sealing agent has been superposed onto the wiring board.

As shown in FIG. 8A, a skin film-shaped sealing agent 9 which was comprised of a novolak-based epoxy resin containing a silica-based filler and which has a thickness of 0.2 mm, was placed onto and temporarily bonded to the wiring board 1, with the connecting bores 10 in the sealing agent 9 being matched with the connecting terminals 6, respectively.

Figure 8B:
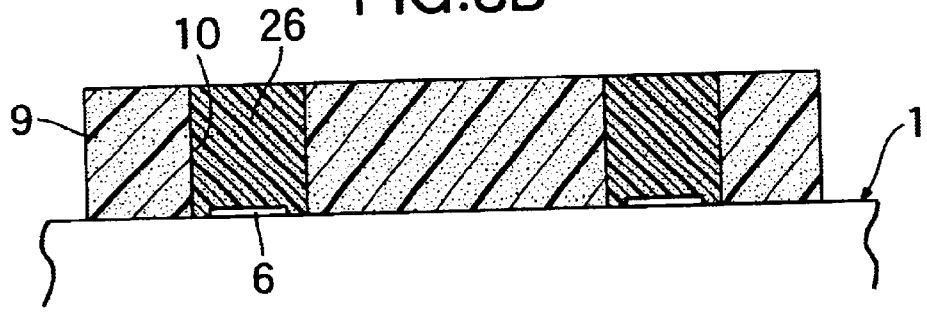
FIG. 8B is a partially broken-away front view of an essential portion, showing a state in which a first conductive paste has been filled into each of the connecting bores in the sealing agent.

As shown in FIG. 8B, using the first conductive paste 26 having the above-described composition, a metal mask screen printing was applied to the surface of the sealing agent 9 to fill the first conductive paste 26 into the connecting bores 10.

Figure 8C:
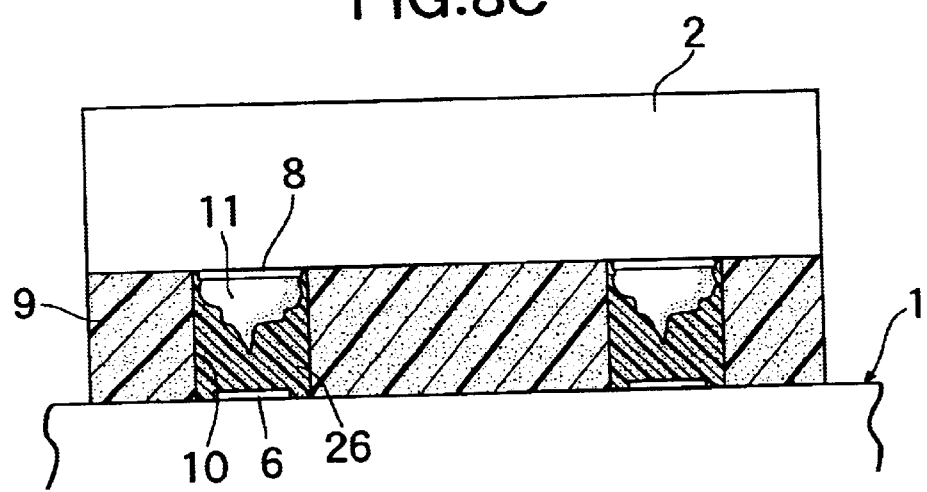
FIG. 8C is a partially broken-away front view of an essential portion, showing a state in which an electronic part has been superposed onto the sealing agent.

As shown in FIG. 8C, the projection 11 of each of the electrodes 8 in the electronic part 2 was put into the first conductive paste 26 in each of the connecting bores 10, whereby the electronic part 2 was superposed onto the sealing agent 9.

Figure 9:
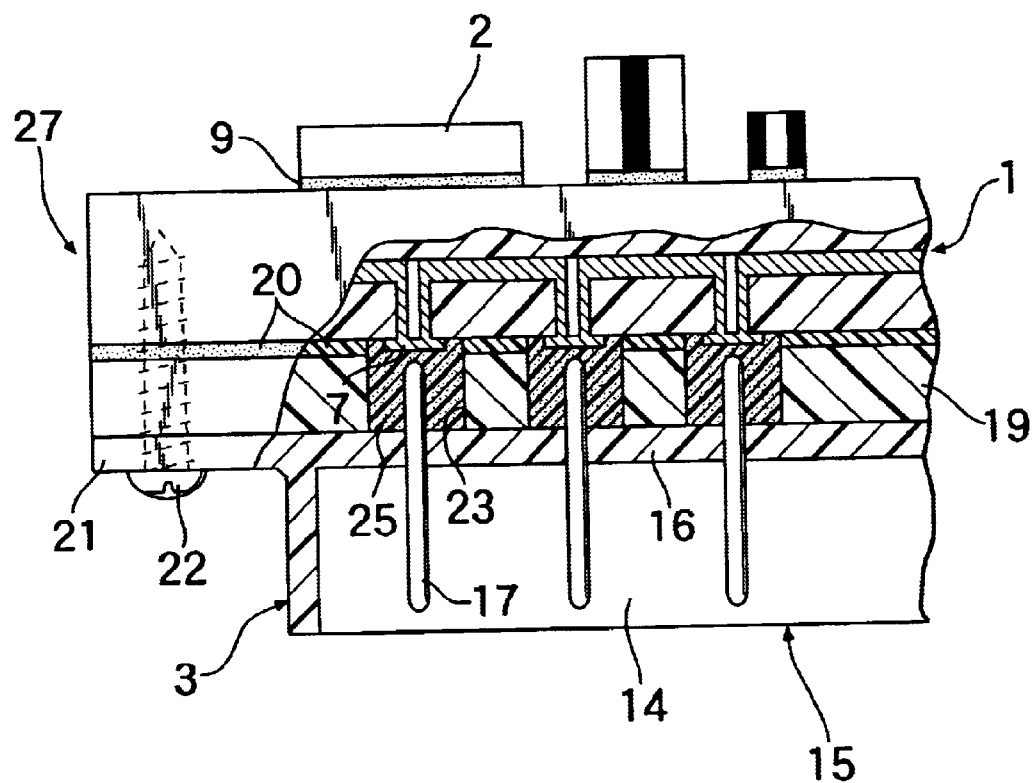
FIG. 9 is a partially cutaway front view of an essential portion of an assembly.

(5) As shown in FIG. 9, one end of each pin-shaped contact 17 of the plug member 3 was put into the second conductive paste 25 in each of the connecting bores 23, whereby the bottom wall 16 and the flange portion 21 of the box 15 were pushed against the electric insulator 19. Then, the plug member 3 was fixed to the wiring board 1 by a plurality of screws 22 to provide an assembly 27.

(6) In a state in which each of the electronic parts 2 had been pushed against the wiring board 1 with a predetermined pressure, the assembly 27 was maintained under heating at 150° C. for 30 minutes to cure the sealing agent 9 on the electronic parts 2 and to cure the first conductive paste 26 and the second conductive paste 25 on the plug member 3, namely to cure the two conductive bonding materials 12 and 18, thereby providing a plug-in type electronic control unit U shown in FIG. 1.

EXAMPLE II

Figure 10:
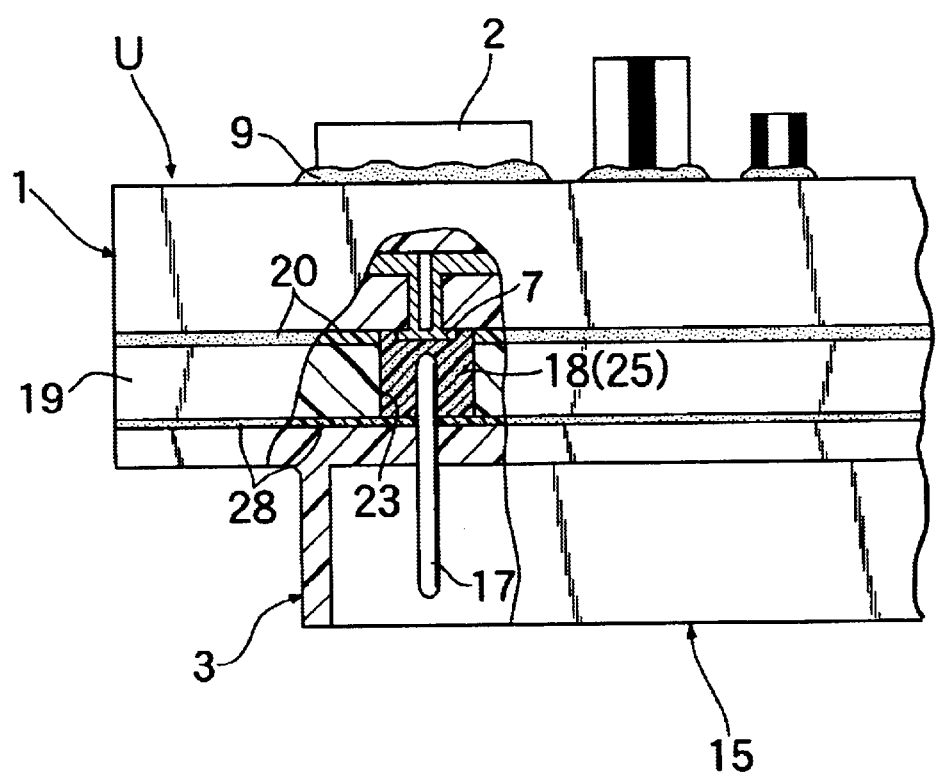
FIG. 10 is a partially cutaway front view of an essential portion of the plug-in type electronic control unit.

A plug-in type electronic control unit U shown in FIG. 10 was produced by fixing the plug member 3 through an electric insulating adhesive 28 in place of the screws 22 used in EXAMPLE I.

The application of the electric insulating adhesive 28 to the electric insulator 19 was performed by a mesh screen printing conducted after filling of the second conductive paste 25 into the connecting bores 23 shown in FIG. 6, followed by semi-curing of the second conductive paste 25 under heating. The reason why the second conductive paste 25 is semi-cured in the above manner is in that the solvent of the second conductive paste 25 is volatilized in advance and, the solvent vapor generated from the second conductive paste 25 during bonding of the electric insulator 19 and the plug member 3 by the electric insulating adhesive 28 is prevented from being confined in the connecting bores 23. Thus, it is possible to reliably perform the electric connection of the connecting terminals 7 with the pin-shaped contacts 17.

The curing of the electric insulating adhesive 28 was conducted simultaneously with the curing of the sealing agent 9 and the curing of the first and second conductive pastes 26 and 25 and thus the curing of the two conductive bonding materials 12 and 18. In this case, the heating temperature was set at 150° C., and the retention time was set at 3 hours.

Alternatively, an electric insulating adhesive film may be used in place of the electric insulating adhesive 28.

EXAMPLE III

Figure 11:
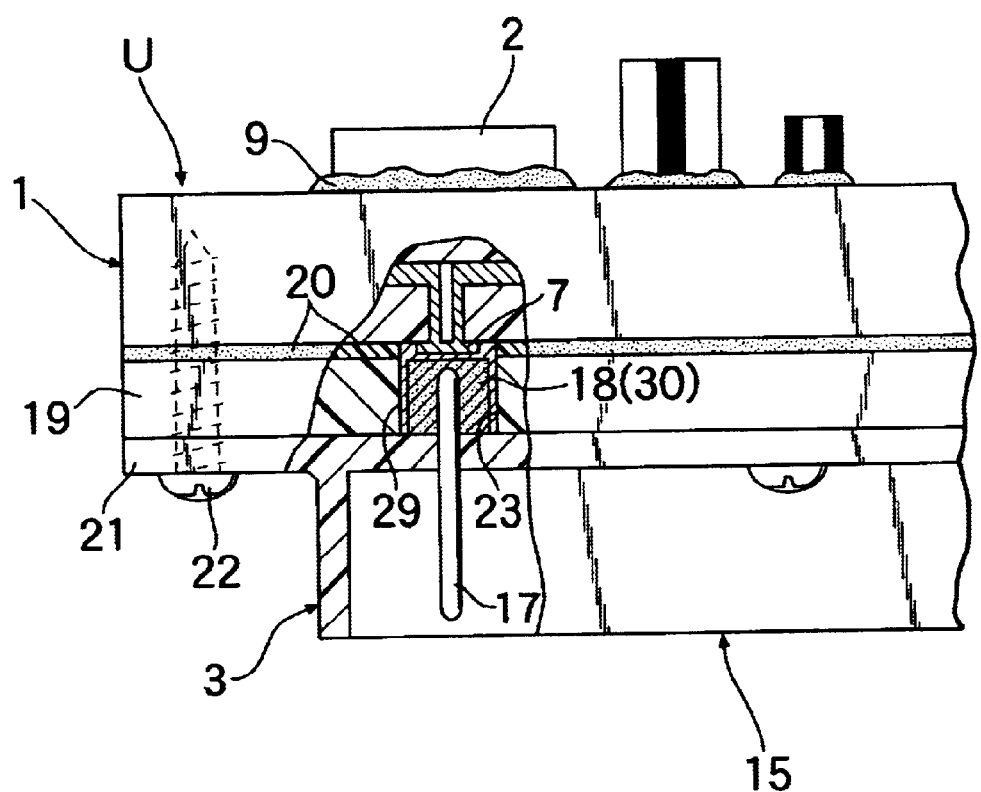
FIG. 11 is a partially cutaway front view of an essential portion of the plug-in type electronic control unit.

A plug-in type electronic control unit U shown in FIG. 11 was produced by performing the connection of the pin-shaped contacts 17 of the plug member 3 with the connecting terminals 7 by use of a solder serving as the conductive bonding material 18. In this case, in order to improve the wettability of the solder to the connecting bores 23, a Cu-plated layer 29 was formed on an inner peripheral surface of each of the connecting bores 23 and on and around each of the connecting terminals 7 after bonding the electric insulator 19. The solder paste used was a paste comprised of an Sn—Ag—Cu based solder powder and a paste-shaped flux based on a synthetic rosin.

A process for producing an electronic control unit U will be described below.

Figure 12:
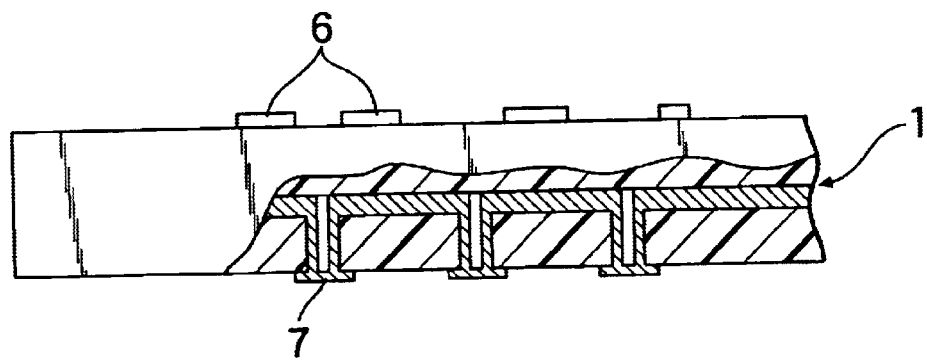
FIG. 12 is a partially cutaway front view of an essential portion of the wiring board.

(1) As shown in FIG. 12, a wiring board 1 having a plurality of connecting terminals 6 and 7 on its top and bottom surfaces was prepared.

Figure 13:
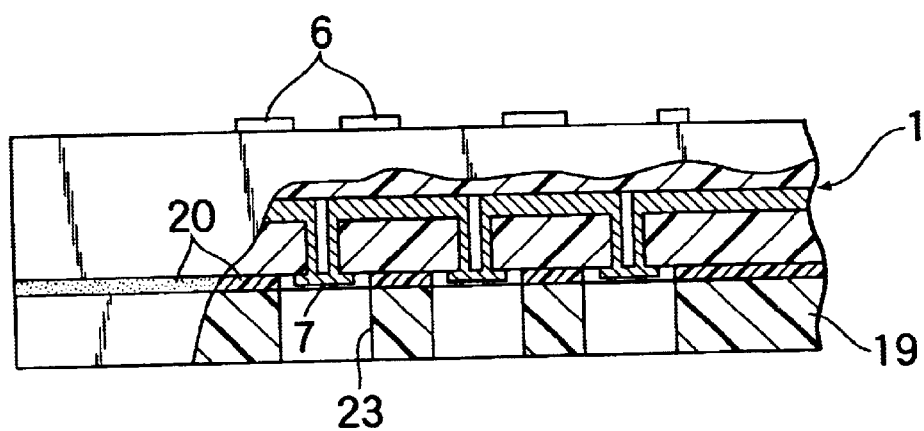
FIG. 13 is a partially cutaway front view of an essential portion, showing a state in which the electric insulator has been bonded to the wiring board.

(2) As shown in FIG. 13, a sheet-shaped electric insulator 19 with a thickness of 1.6 mm having a plurality of connecting bores 23 with a diameter of 1.5 mm was bonded by pressing to the bottom surface of the wiring board 1 through an electric insulating adhesive 20, and each connecting terminal 7 was located within corresponding one of the connecting bores 23.

Figure 14:
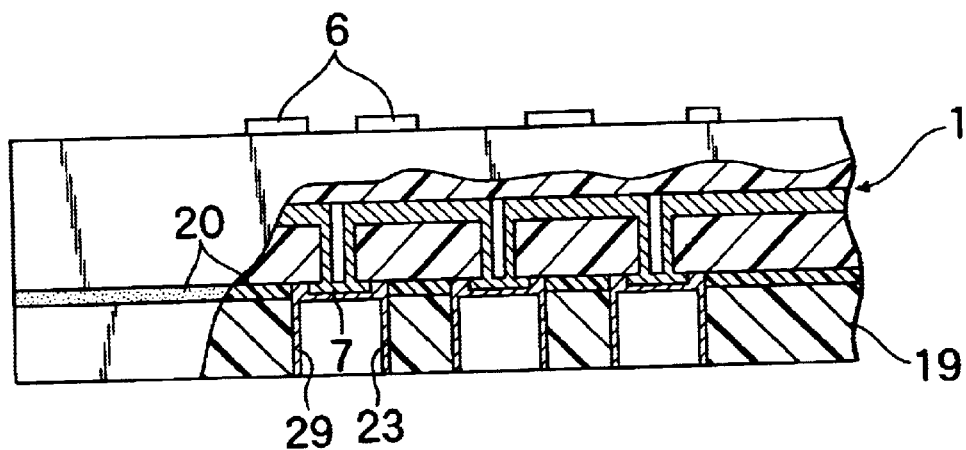
FIG. 14 is a partially cutaway front view of an essential portion, showing a state in which a Cu-plated layer has been formed in the connecting bores in the electric insulator.

(3) As shown in FIG. 14, an electroless panel Cu-plating process, an electrolyzed-portion Cu-plating process and a flush etching process were applied to an inner peripheral surface of each of the connecting bores 23 to form a Cu-plated layer 29 having a thickness of 15 to 25 μm.

Figure 15:
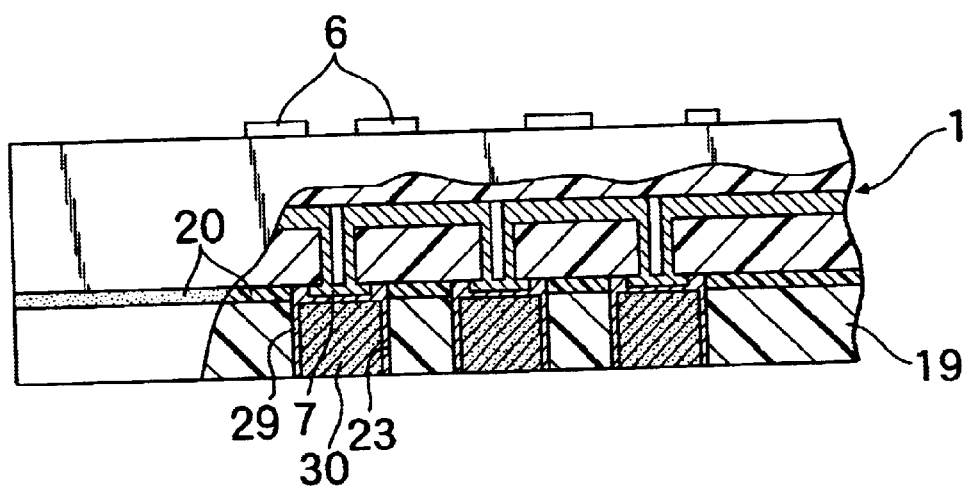
FIG. 15 is a partially cutaway front view of an essential portion, showing a state in which a solder paste has been filled in each of the connecting bores in the electric insulator.

(4) As shown in FIG. 15, using a solder paste 30 having a composition as described above, a metal mask screen printing was applied to a surface of an electric insulator 19 to fill the solder paste 30 in each of the connecting bores 23.

Figure 16:
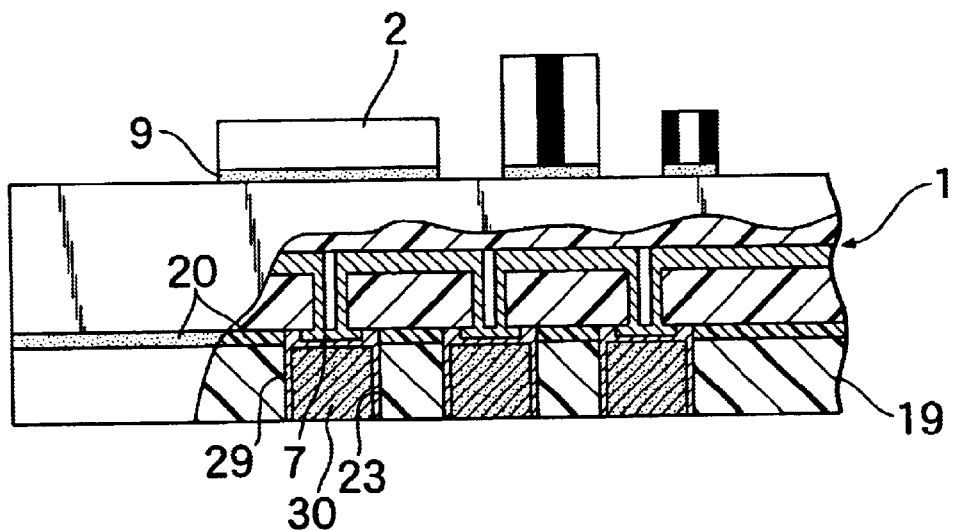
FIG. 16 is a partially cutaway front view of an essential portion, showing a state in which the electronic part has been mounted on the wiring board.

(5) As shown in FIG. 16, a plurality of electronic parts 2 were mounted on the top surface of the wiring board 1. This mounting was carried out in the procedure shown in FIG. 8, as in EXAMPLE I.

Figure 17:
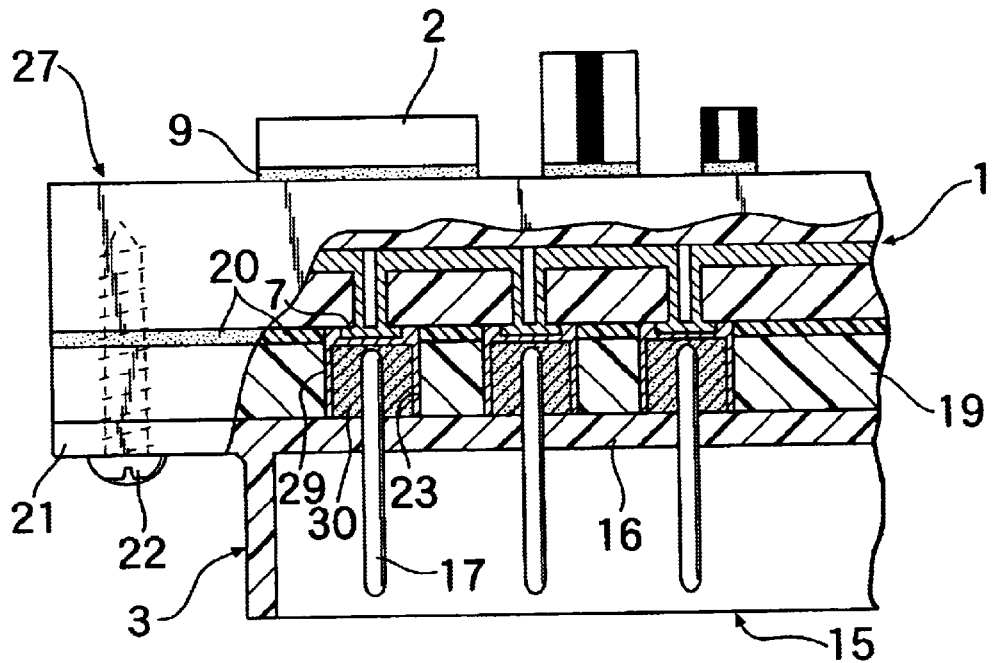
FIG. 17 is a partially cutaway front view of an essential portion of the assembly.

(6) As shown in FIG. 17, one end of each pin-shaped contact 17 of the plug member 3 was put into the solder paste 30 in each of the connecting bores 23, whereby the bottom wall 16 and the flange portion 21 of the box 15 were pushed against the electric Insulator 19. Then, the plug member 3 was fixed to the wiring board 1 by a plurality of screws 22 to provide an assembly 27.

(7) In a state in which each of the electronic parts 2 had been pushed against the wiring board 1 with a predetermined pressure, the assembly 27 was maintained under heating at 150° C. for 90 seconds and then at 260° C. for 1 minute to completely melt the solder paste 30. Thereafter, the assembly 27 was cooled to cure the solder and thus the conductive bonding material 18 at about 170° C. Further, the assembly 27 was maintained under heating at 150° C. for 30 minutes to cure the sealing agent 9 on the electronic parts 2 and to cure the first conductive paste 26 and thus the conductive bonding material 12, thereby providing a plug-in type electronic control unit U shown in FIG. 11.

EXAMPLE IV

Figure 18:
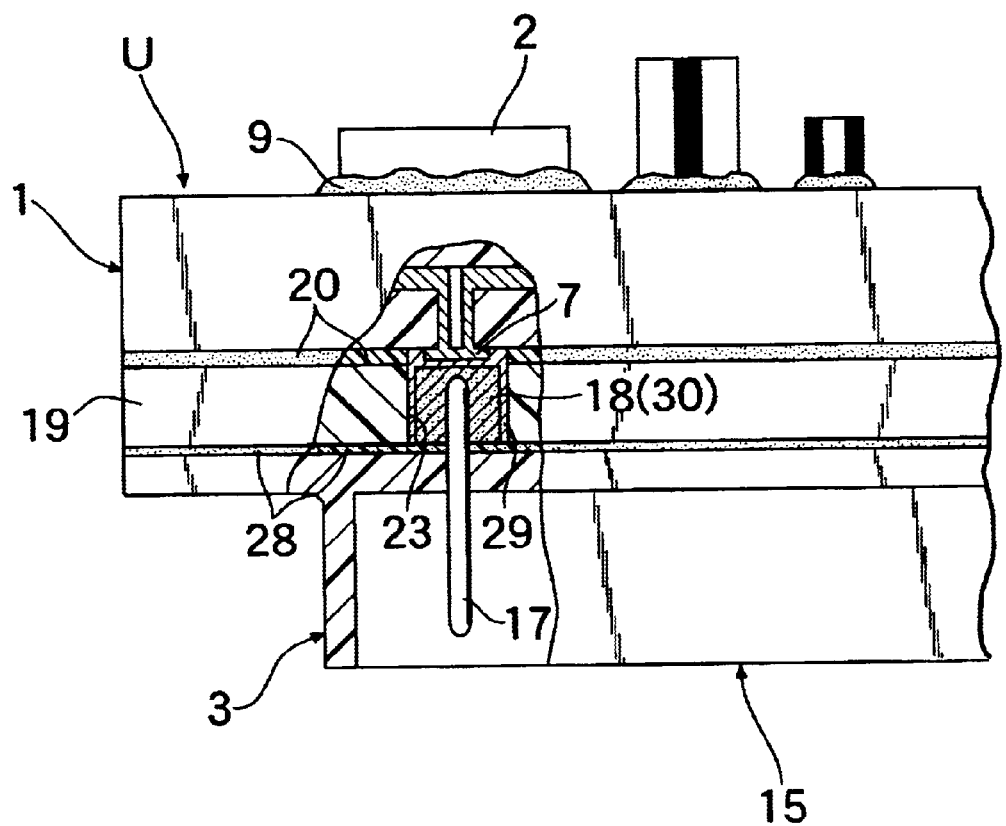
FIG. 18 is a partially cutaway front view of an essential portion of the plug-in type electronic control unit.

A plug-in type electronic control unit U shown in FIG. 18 was produced by fixing the plug member 3 through an electric insulating adhesive 28 in place of the screws 22 used in EXAMPLE III.

The application of the electric insulating adhesive 28 to the electric insulator 19 was performed by a mesh screen printing conducted after filling of the solder paste 30 into the connecting bores 23 shown in FIG. 15, followed by melting of the solder paste 30 under heating to provide a soldering material. The reason why the solder paste 30 is once molten in the above manner is in that a gas generated from the flux of the solder paste 30 is vented and the gas generated by the electric insulating adhesive 28 is prevented from being confined in the connecting bores 23. Thus, it is possible to reliably perform the electric connection of the connecting terminals 7 with the pin-shaped contacts 17.

If the electric insulating adhesive 28 is mixed into the solder paste 30, a failure of melting of the solder paste 30 may occur in some cases. However, if the solder paste 30 is once molten as described above, such problem can be avoided.

The conditions for the melting of the solder paste 30 are the same as in the case of EXAMPLE III.

The curing of the electric insulating adhesive 28 is carried out simultaneously with the curing of the sealing agent 9 on the electronic parts 2 and the curing of the first conductive paste 26 and thus the curing of the conductive bonding material 12 after the melting and curing of the solder paste 30, namely, after the curing of the conductive bonding material 18 on the plug member 3. In this case, the heating temperature was set at 150° C., and the retention time was set at 3 hours.

Alternatively, an electric insulating adhesive film may be used in place of the electric insulating adhesive 28. In a case where an electric insulating adhesive or an electric insulating adhesive film is used wherein a gas generated from the solder paste arises no problem, or wherein even if the gas is mixed into the solder paste, there is no possibility that a failure of melting of the solder paste is not caused, the melting of the solder paste is not conducted before the application of, or before the affixing of the electric insulating adhesive or the electric insulating adhesive film.

EXAMPLE V

Figure 19:
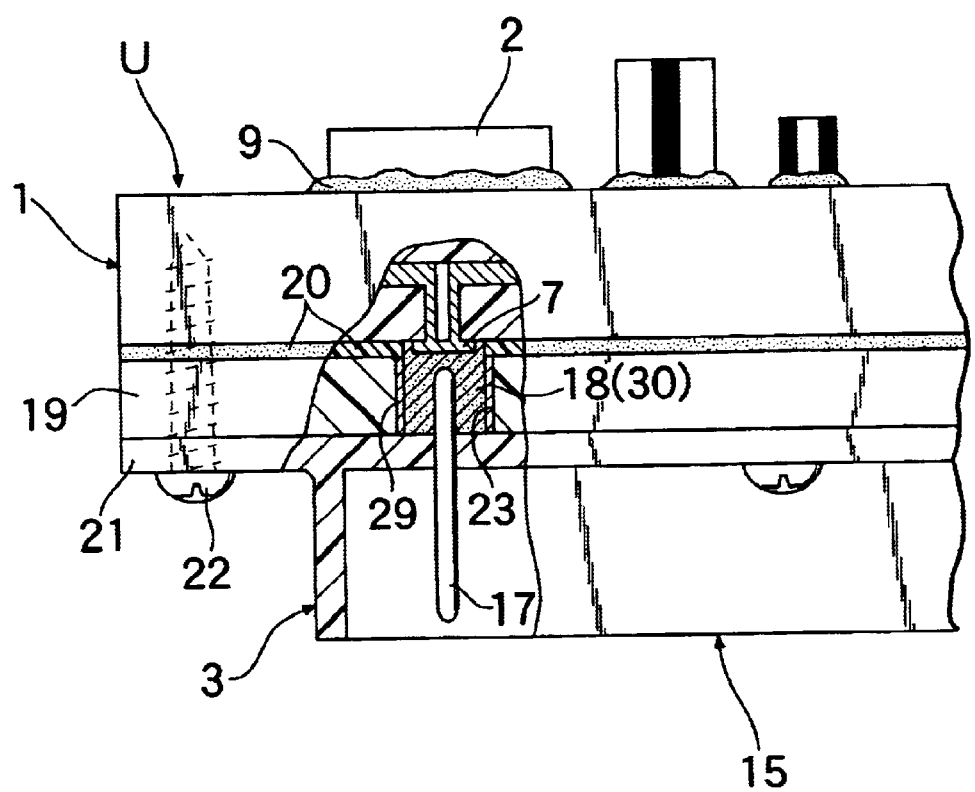
FIG. 19 is a partially cutaway front view of an essential portion of the plug-in type electronic control unit.

A plug-in type electronic control unit U shown in FIG. 19 was produced by carrying out the connection of the pin-shaped contacts 17 of the plug member 3 with the connecting terminals 7 by use of a solder paste 30 similar to that in EXAMPLE III. In this case, in order to improve the wettability of the solder to the connecting bores 23, an electric insulator 19 having a Cu-plated layer 29 on an inner peripheral surface of each of connecting bores 23 was used.

A process for producing an electronic control unit U will be described below.

Figure 20:
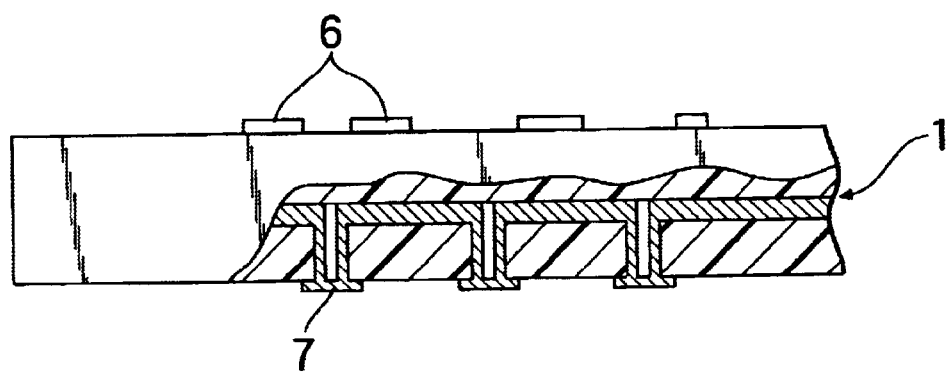
FIG. 20 is a partially cutaway front view of an essential portion of the wiring board.

(1) As shown in FIG. 20, a wiring board 1 having a plurality of connecting terminals 6 and 7 on its top and bottom surfaces was prepared.

Figure 21:
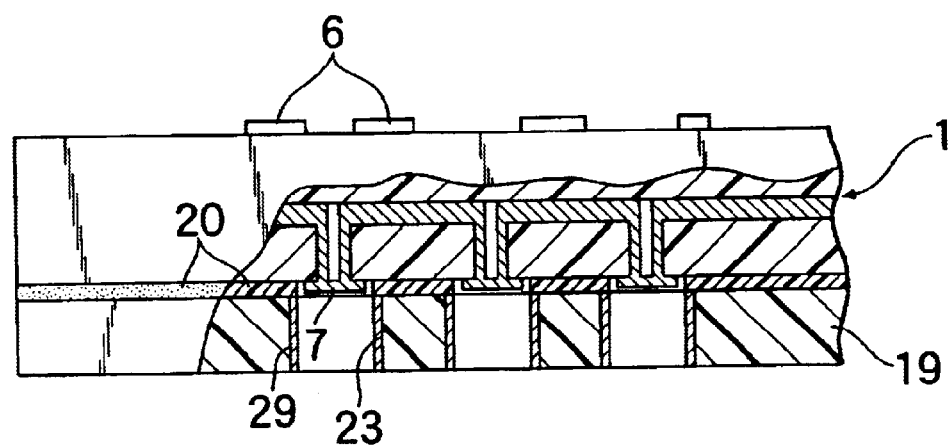
FIG. 21 is a partially cutaway front view of an essential portion, showing a state in which the electric insulator has been bonded to the wiring board.

(2) As shown in FIG. 21, a sheet-shaped electric insulator 19 with a thickness of 1.6 mm having a plurality of connecting bores 23 with a diameter of 1.5 mm was prepared. An electroless panel Cu-plating process, an electrolyzed-portion Cu-plating process and a flush etching process were applied to an inner peripheral surface of each of the connecting bores 23 to form a Cu-plated layer 29 having a thickness of 15 to 25 μm. Thereafter, the electric insulator 19 was bonded by pressing to the bottom surface of the wiring board 1 through an electric insulating agent 20, and each of the connecting terminals 7 was located in corresponding one of the connecting bores 23.

Figure 22:
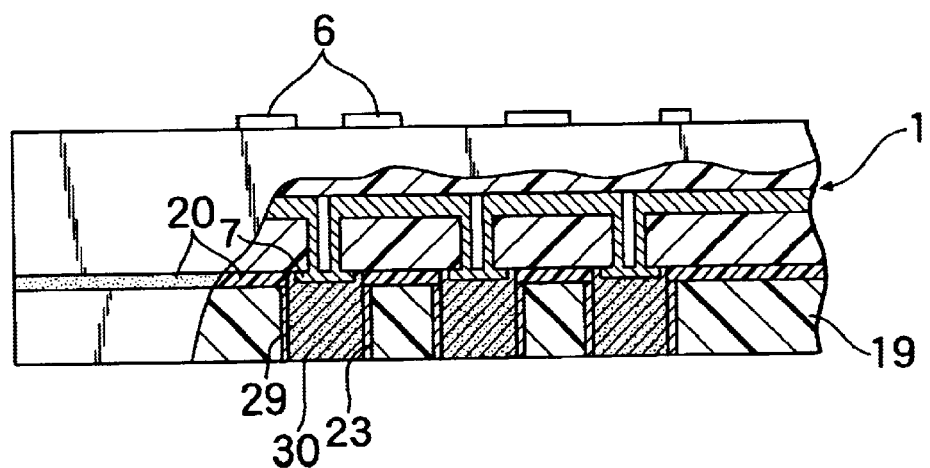
FIG. 22 is a partially cutaway front view of an essential portion, showing a state in which the solder paste has been filled into each of the connecting bores in the electric insulator.

(3) As shown in FIG. 22, a solder paste 30 having a composition as described above was prepared, and a metal mask screen printing was applied to a surface of the electric insulator 19 to fill the solder paste 30 in each of the connecting bores 23.

Figure 23:
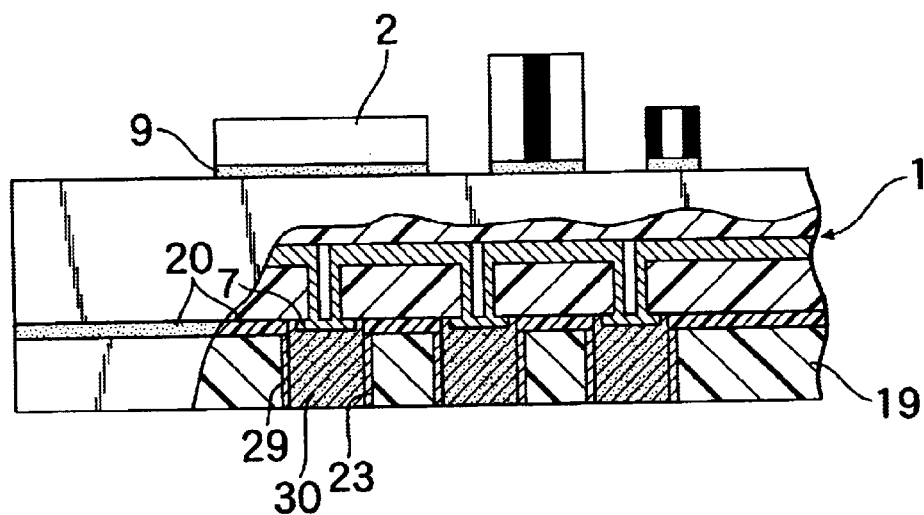
FIG. 23 is a partially cutaway front view of an essential portion, showing a state in which the electronic part has been mounted on the wiring board.

(4) As shown in FIG. 23, a plurality of electronic parts 2 were mounted on the top surface of the wiring board 1. This mounting was carried out in the procedure shown in FIG. 8, as in EXAMPLE I.

Figure 24:
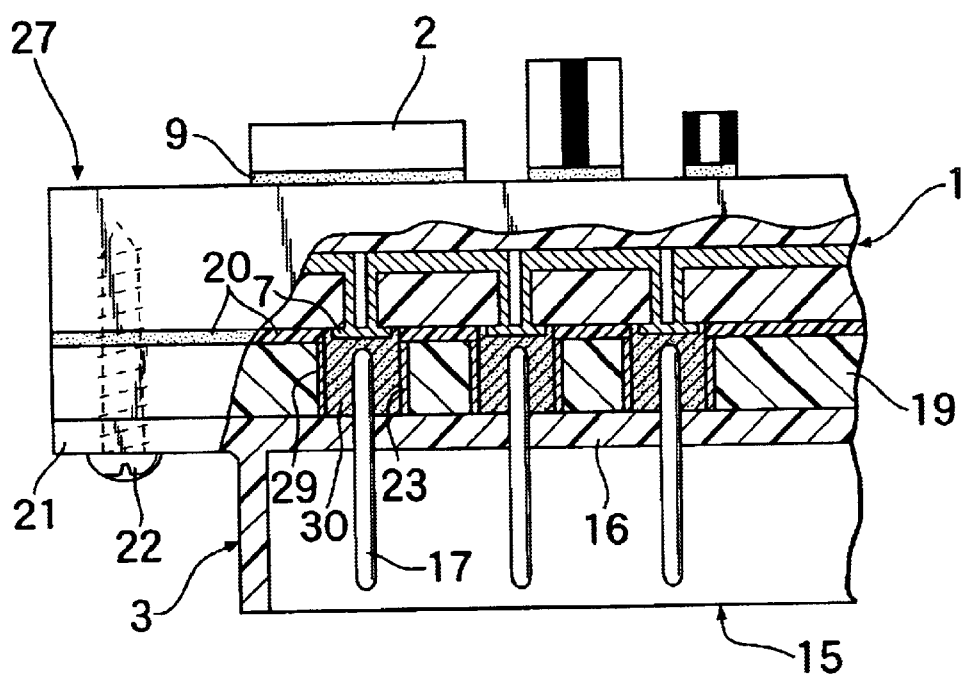
FIG. 24 is a partially cutaway front view of an essential portion of the assembly.

(5) As shown in FIG. 24, one end of each pin-shaped contact 17 of the plug member 3 was put into the solder paste 30 in each of the connecting bores 23, whereby the bottom wall 16 and the flange portion 21 of the box 15 were pushed against the electric insulator 19. Then, the plug member 3 was fixed to the wiring board 1 by a plurality of screws 22 to provide an assembly 27.

(6) In a state in which each of the electronic parts 2 had been pushed against the wiring board 1 with a predetermined pressure, the assembly 27 was maintained under heating at 150° C. for 90 seconds and then at 260° C. for 1 minute to completely melt the solder paste 30. Thereafter, the assembly 27 was cooled to cure the solder at about 170° C. to provide a conductive bonding material 18. Further, the assembly 27 was maintained under heating at 150° C.

for 30 minutes to cure the sealing agent 9 on the electronic parts 2 and to cure the first conductive paste 26 and thus the conductive bonding material 12, thereby providing a plug-in type electronic control unit U shown in FIG. 19.

EXAMPLE VI

Figure 25:
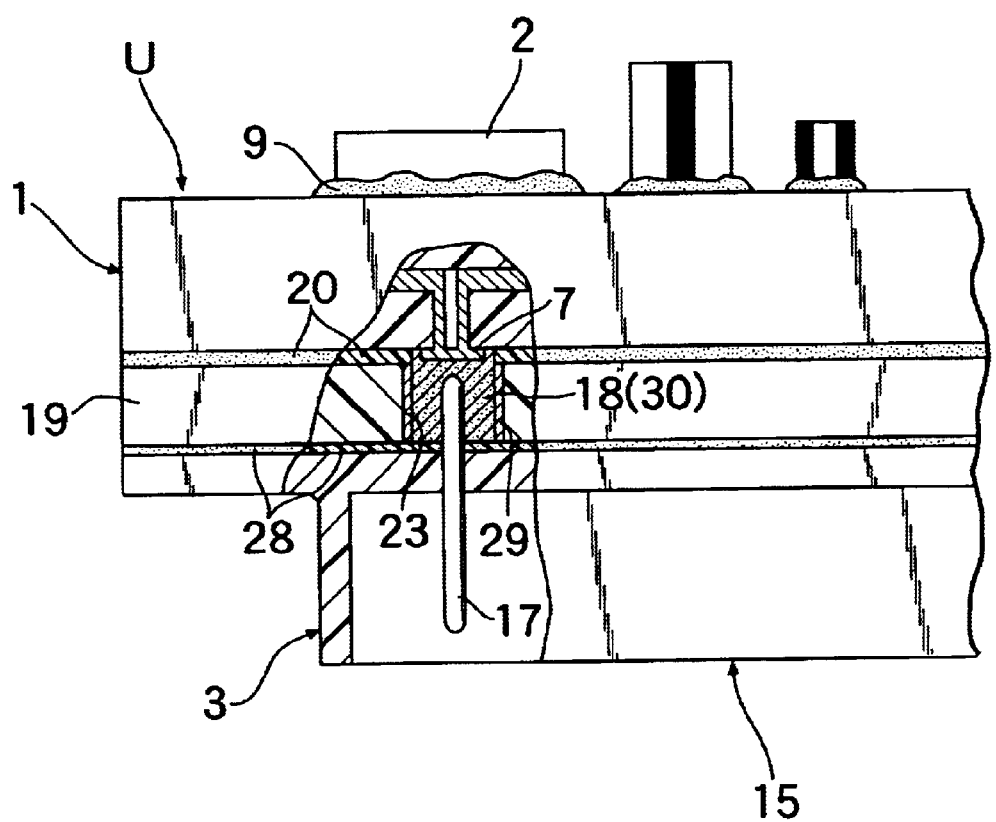
FIG. 25 is a partially cutaway front view of an essential portion of the plug-in type electronic control unit.

A plug-in type electronic control unit U shown in FIG. 25 was produced by carrying out the fixing of the plug member 3 through an electric insulating adhesive 28 in place of the screws 22 in EXAMPLE V.

The application of the electric insulating adhesive 28 to the electric insulator 19 was performed by a mesh screen printing conducted after filling of the solder paste 30 into the connecting bores 23 shown in FIG. 22, followed by melting of the solder paste 30 under heating to provide a solder. The reason why the solder paste 30 is once molten in the above manner is as described in EXAMPLE IV. The conditions for curing of the electric insulating adhesive 28 are also as described in EXAMPLE IV.

In the connection 13 of the electronic part 2 of each of the electronic control units U described in EXAMPLES I to VI, the diameter a of the projection 11 was nearly equal to 0.15 mm (a~0.15 mm); the thickness b of the sealing agent 9 was nearly equal to 0.2 mm (b~0.2 mm); the distance c between the tip end of the projection 11 and the connecting terminal 6 was nearly equal to 0.05 mm (c~0.05 mm); and the Shore hardness of the conductive bonding material 12 was of about 80, while the Shore hardness of the sealing agent 9 was of about 91.

In the connection 24 of the plug member 3, the diameter d of the pin-shaped contact 17 was nearly equal to 0.5 mm (d~0.5 mm); the thickness e of the electric insulator 19 was nearly equal to 1.6 mm (e~1.6 mm); the distance f between the tip end of the pin-shaped contact 17 and the connecting terminal 7 was nearly equal to 0.2 mm (f~0.2 mm); and the Shore hardness of the conductive bonding material 18, namely, a conductive bonding material derived from the second conductive paste 25 was of about 80; the Shore hardness of a conductive bonding material derived from the solder paste 30 was of about 83; while the Shore hardness of the electric insulator 19 was of about 95. It should be noted that the distance f is a distance between the Cu-plated layer 29 and the tip end of the pin-shaped contact 17 in EXAMPLES III and IV shown in FIGS. 11 and 18.

B. Unit of Connection of Electronic Part and Wiring Board

Figure 26:
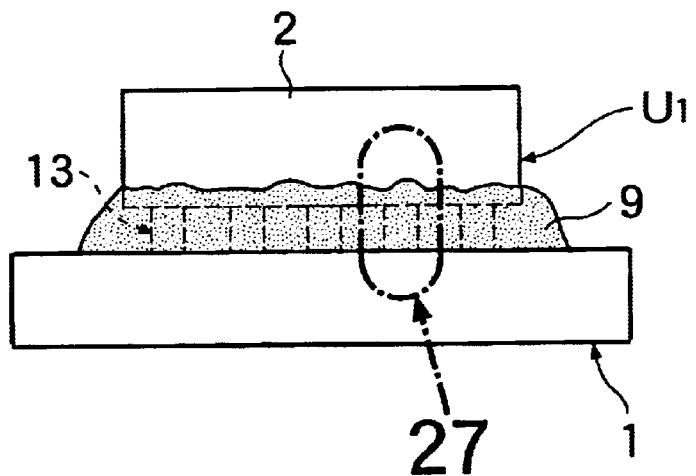
FIG. 26 is a front view of a unit of connection of the electronic part with the wiring board.
Figure 27:
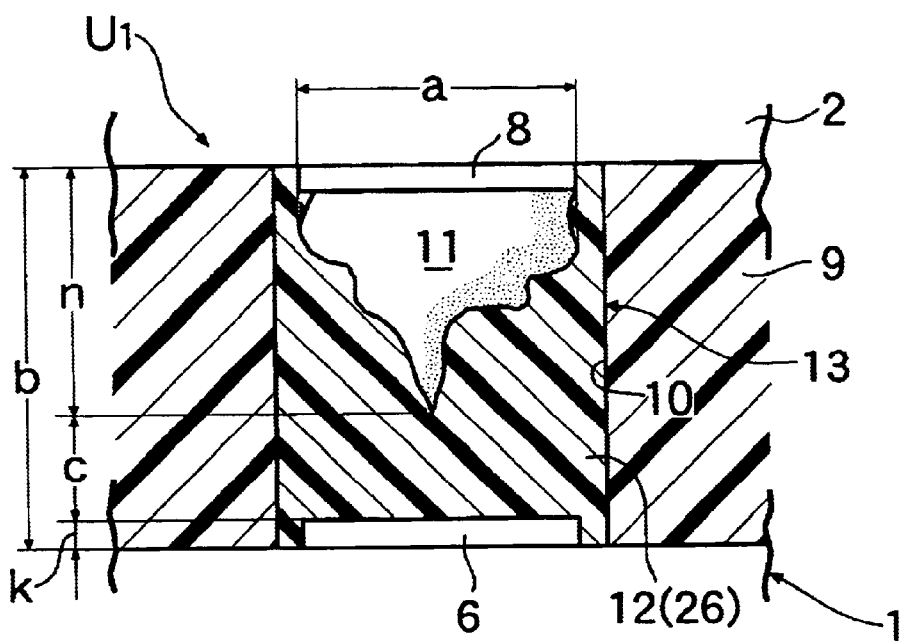
FIG. 27 is an enlarged sectional view of a portion indicated by an arrow 27 in FIG. 26.

A unit U1 of connection of an electronic part 2 and a wiring board 1 shown in FIGS. 26 and 27 has a connecting structure similar to that shown in FIGS. 1 and 2. Therefore, in FIGS. 26 and 27, the same components or portions as those in FIGS. 1 and 2 are designated by like reference characters, and the description of the connecting structure is omitted.

In producing the connection unit U1, the following mounting process is employed.

Figure 28:
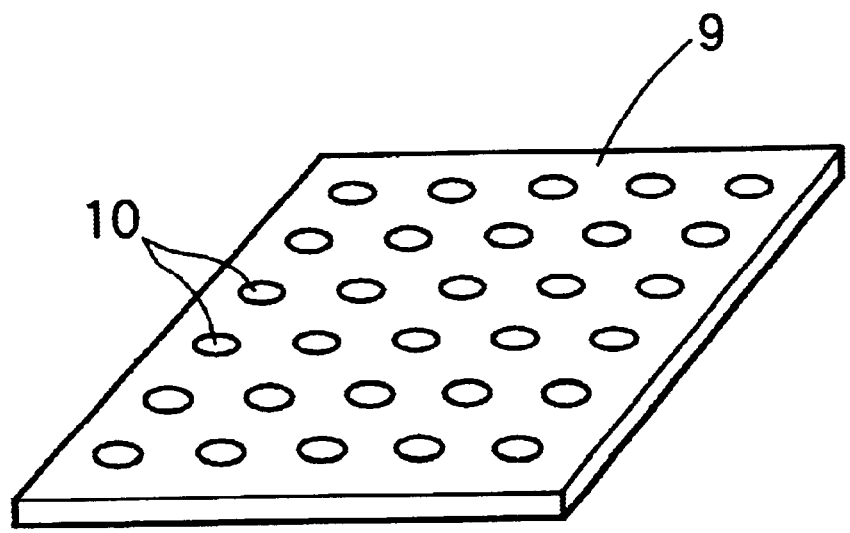
FIG. 28 is a perspective view of a skin film-shaped sealing agent.

As shown in FIG. 28, a skin film-shaped sealing agent 9 having thermosetting and electric insulating properties is prepared. This sealing agent 9 has a plurality of connecting bores 10 corresponding to a plurality of electrodes 8 of an electronic part 2, respectively.

Figure 29:
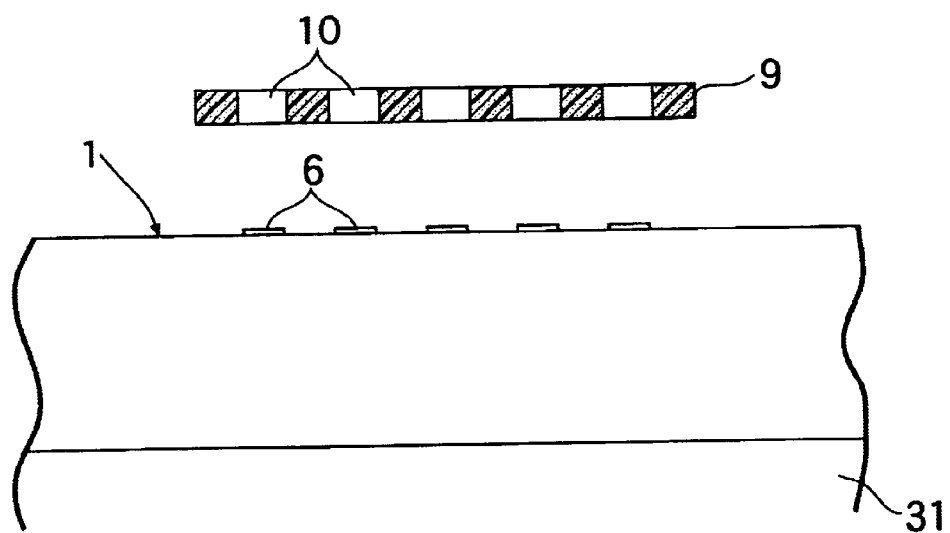
FIG. 29 is a partially broken-away front view of an essential portion, showing a state in which the skin film-shaped sealing agent has been disposed above the wiring board.

(i) As shown in FIG. 29, a wiring board 1 having a plurality of connecting terminals 6 corresponding to the plurality of electrodes 8 of the electronic part 2 is placed onto a heating plate 31 and heated to a predetermined temperature and then, the skin film-shaped sealing agent 9 is disposed above the wiring board 1 with the connecting bores 10 therein being matched with the connecting terminals 6, respectively.

Figure 30:
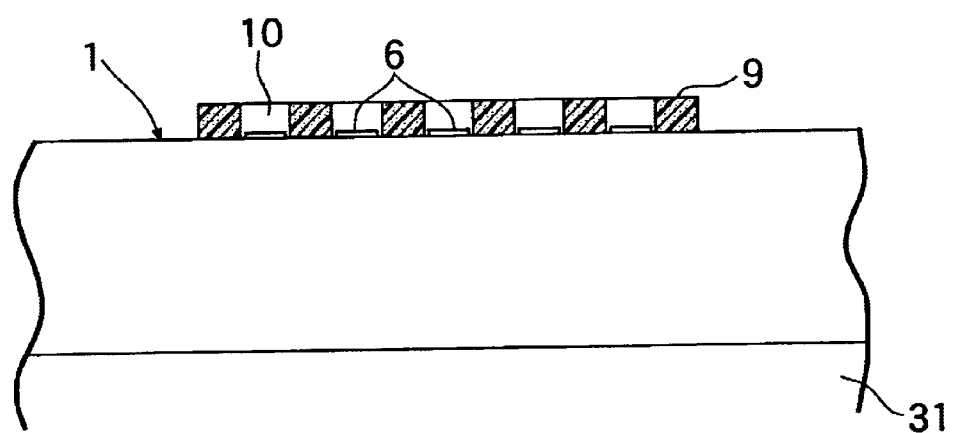
FIG. 30 is a partially broken-away front view of an essential portion, showing a state in which the skin film-shaped sealing agent has been superposed on the wiring board.

(ii) As shown in FIG. 30, the sealing agent 9 is superposed onto the wiring board 1 and then, pushed against the wiring board 1 for a predetermined time with a predetermined pressure for close adhesion by a temporary bonding.

Figure 31:
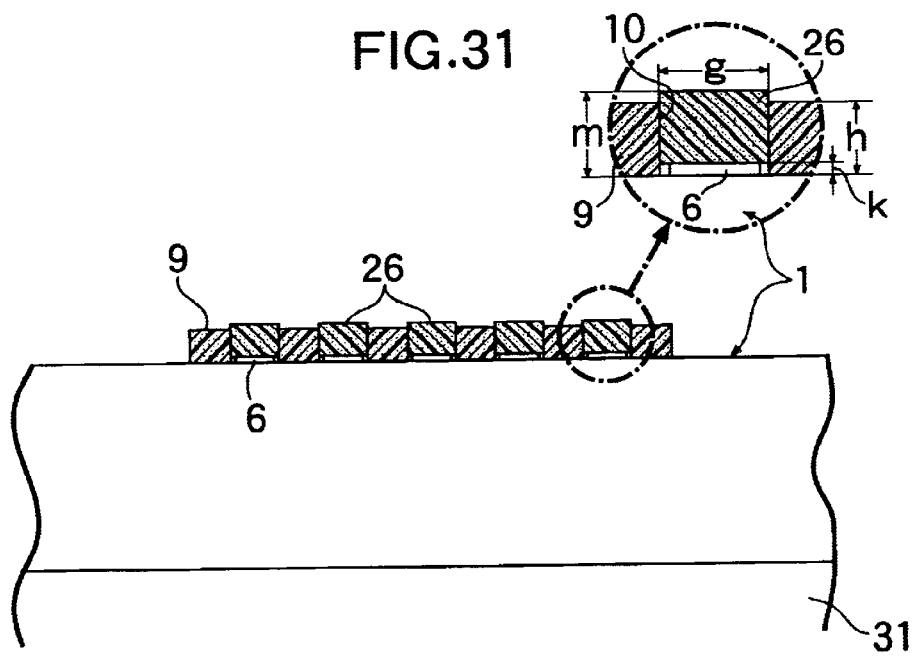
FIG. 31 is a partially broken-away front view of an essential portion, showing a state in which the first conductive paste has been filled into each of the connecting bores in the skin film-shaped sealing agent.

(iii) As shown in FIG. 31, using a first conductive paste 26 having a composition as described above, a screen printing is applied to a surface of the sealing agent 9 to fill the first conductive paste 26 in each of the connecting bores 10. In this case, in consideration of an amount of conductive bonding material 12 contracted due to the curing thereof, the surface of the first conductive paste 26 is disposed, so that it is slightly higher in level than an opening edge of each connecting bore 10.

Figure 32:
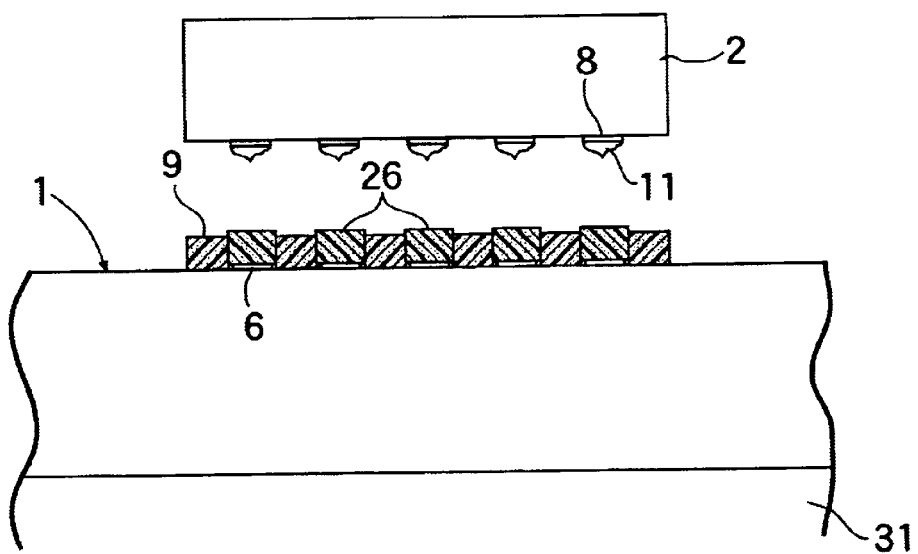
FIG. 32 is a partially broken-away front view of an essential portion, showing a state in which the electronic part has been disposed above the skin film-shaped sealing agent.

(iv) As shown in FIG. 32, the temperature of the wiring board 1 is risen and then, the electronic part 2 is disposed above the sealing agent 9 with the electrodes 8 being matched with the connecting bores 10, respectively.

Figure 33:
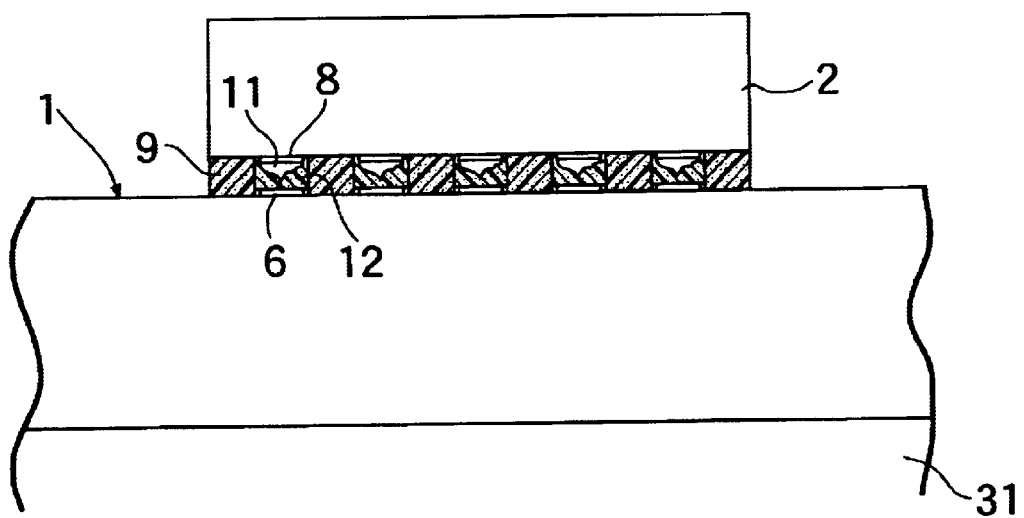
FIG. 33 is a partially broken-away front view of an essential portion, showing a state in which the electronic part has been bonded to the wiring board through the skin film-shaped sealing agent.

(v) As shown in FIG. 33, the projection 11 of each electrode 8 of the electronic part 2 is put into the first conductive paste 26 in each of the connecting bores 10, whereby the electronic part 2 is superposed onto the sealing agent 9. In this case, the curing and contraction of the conductive bonding material 12 are being advanced with rising of the temperature of the wiring board 1 and hence, protrusion of the paste 26 from the connecting bores 10 is avoided. Then, the electronic part 2 is pushed against the wiring board 1 for a predetermined time with a predetermined pressure to cure the sealing agent 9 and the first conductive paste 26 and thus the conductive bonding material 12 under heating and pressurizing conditions, thereby bonding the electronic part 2 to the wiring board 1.

(vi) To completely cure the sealing agent 9, the bonded electronic part 2 and wiring board 1 are placed into an oven; maintained at a predetermined temperature for a predetermined time under the atmospheric pressure and then cooled within the oven to provide a connection unit U1.

In the above-described process, the connection between the projection 11 of each electrode 8 and each connecting terminal 6 and the application of the sealing agent 9 to each of the connection 13 and the curing thereof are carried out at the same step. Therefore, the operability of mounting of the electronic part 2 can be improved to reduce the mounting cost.

The formation of each of the connecting bores 10 in the skin film-shaped sealing agent 9 may be conducted after bringing a skin film-shaped sealing agent 9 having no bores into close contact with the wiring board 1. From this viewpoint, a material for forming the sealing agent 9 which may be used, is, for example, a liquid epoxy acrylate resin containing a multi-function acrylate monomer, a liquid polyester acrylate resin containing a multi-function acrylate monomer, and the like, each of which is an ultraviolet-curing resin.

If required, a high-adhesive force liquid epoxy resin which is a thermosetting adhesive may be interposed between the skin film-shaped sealing agent 9 and the electronic part 2. A soldering power can be used as the conductive bonding material 12.

Particular examples of production of the connection unit U1 will be described below.

PRODUCING EXAMPLE 1

(i) A transfer molding was carried out using a novolak-based epoxy resin containing a silica-based filler to form a skin film-shaped sealing agent 9 which was 11 mm long, 11 mm wide and 0.2 mm thick.

(ii) As shown in FIG. 28, for example, in correspondence to thirty-two electrodes 8 of an electronic part 2 and the same number of connecting terminals 6 of a wiring board 1 having the above-described structure, thirty-two connecting bores 10 each having a diameter g equal to 0.14 mm were formed in the sealing agent 9 by excimer laser.

(iii) As shown in FIG. 29, the wiring board 1 was placed onto a heating plate 31 and heated to 120° C. and then, the sealing agent 9 was disposed above the wiring board 1 with the connecting bores 10 therein being matched with the connecting terminals 6, respectively.

(iv) As shown in FIG. 30, the sealing agent 9 was superposed onto the wiring board 1 and then, pushed against the wiring board 1 for 10 seconds with a pressure of 80 gf/cm² for close adhesion by a temporary bonding.

(v) As shown in FIG. 31, using a first conductive paste 26 (containing an amount A of a solvent mixture equal to 45.8% by volume) having a composition as described above and a #200 mesh screen (with a thickness of an emulsifying agent of 10 μm), a screen printing was applied to the surface of the sealing agent 9 to fill the first conductive paste 26 into each of the connecting bores 10. In this case, the surface of the first conductive paste 26 was 0.1 mm higher in level than an opening edge of the connecting bore 10. Namely, the depth $\underline{h}$ of the connecting bore 10 was equal to 0.2 mm; the thickness $\underline{k}$ of the connecting terminal 6 was equal to 0.018 mm; and the height $\underline{m}$ of the first conductive paste 26 was equal to 0.192 mm.

(vi) As shown in FIG. 32, the temperature of the wiring board 1 was risen to 150° C. and then, the electronic part 2 was disposed above the sealing agent 9 with the electrodes 8 thereof being matched with the connecting bores 10, respectively.

(vii) As shown in FIG. 27, the diameter $\underline{a}$ of the projection 11 of each electrode 8 of the electronic part 2 was equal to 0.14 mm, and the length n of protrusion of the projection 11 (including the thickness of the electrode 8 and so on) was equal to 0.111 mm. As shown in FIG. 33, each of the projections 11 was put into the first conductive paste 26 in each of the connecting bores 10, whereby the electronic part 2 was superposed onto the sealing agent 9. Then, the electronic part 2 was pushed against the wiring board 1 for 20 seconds with a pressure of 200 gf/cm² to cure the sealing agent 9 and the first conductive paste 26 and thus the conductive bonding material 12 under heating and pressurizing conditions, whereby the electronic part 2 was bonded to the wiring board 1.

(viii) To completely cure the sealing agent 9, the bonded electronic part 2 and wiring board 1 were placed into an oven, where they were maintained at 150° C. for 20 minutes under the atmospheric pressure. Thereafter, they were cooled in the oven to produce a connection unit U1 (Example).

In this connection unit U1, the linear expansion coefficient of the electric part 2 was of $2.7 \times 10^{-6}/°$ C., while the linear expansion coefficient of the wiring board 1 was of $1.4 \times 10^{-5}/°$ C. As shown in FIG. 27, the thickness $\underline{b}$ of the sealing agent 9 between the electronic part 2 and the wiring board 1 was equal to 0.166 mm, the distance $\underline{c}$ between the tip end of the projection 11 and the connecting terminals 6 was equal to 0.037 m, and the hardness (Shore hardness) of the sealing agent 9 was of 91 HSD, while the hardness (Shore hardness) of the conductive bonding material 12 was of 80 HSD. As described above, the diameter g of the connecting bore 10 was equal to 0.14 mm; the diameter $\underline{a}$ of the projection 11 was equal to 0.14 mm; the length $\underline{n}$ of protrusion of the projection 11 was equal to 0.111 mm; and the thickness $\underline{k}$ of the connecting terminal 6 was equal to 0.018 mm.

For comparison, a plurality of connection units U1 were produced by carrying out the steps (i) to (viii) in the same manner, except that the amount $\underline{A}$ of a solvent mixture in the first conductive paste 26 was varied.

For these connection units U1, the state of contact of the projection 11 of each electrode 8 with the conductive bonding material 12 was examined to provide results given in Table 1. The above-described connection unit U1 (Example) is given as example 3 in Table 1.

TABLE 1

| | First conductive paste | | | |
| --- | --- | --- | --- | --- |
| Connection unit | Amount of solvent mixture (% by volume) | Volume after filling (× 10³ mm³) | Volume of conductive bonding material after being cured (× 10³ mm³) | State of contact between projection with conductive bonding material |
| Example 1 | 62.5 | 2.95 | 1.11 | Poor |
| Example 2 | 58.3 | | 1.23 | Good |
| Example 3 | 45.8 | | 1.60 | Good |
| Example 4 | 29.2 | | 2.09 | Good |
| Example 5 | 25.0 | | 2.21 | conductive bonding material protruded from connecting bore |

In a case where the sizes of the projection 11 and the connecting bore 10 and the height of the first conductive paste 26 after being filled into the connecting bore 10 have been set in the above manner, as shown in Table 1, if the amount A of the solvent mixture in the first conductive paste 26 is set in a range of 29.2% by volume $\leq A \leq 58.3\%$ by volume as in the examples 2 to 4, the state of contact of the projection 11 of the electrode 8 with the conductive bonding material 12 can be improved, and the protrusion of the first conductive paste 26 from the connecting bore 10 can be prevented. In this case, the amount A of the solvent mixture is preferably in a range of 30% by volume $\leq A \leq 55\%$ by volume.

In the case of the example 1, the amount of the conductive bonding material 12 is too small and hence, a gap is produced between the projection 11 and the conductive bonding material 12 as a result of the hardening and contraction of the conductive bonding material 12. In the case of the example 5, the amount of the conductive bonding material 12 is too large and hence, the conductive bonding material 12 protrudes from the connecting bore 10 to shortcircuit the adjacent electrodes 8. In the examples 2 and 4 in Table 1, the thickness b, the distance c and the hardness (HSD) are the same as those in the example 3.

Then, various connection units U1 having different thickness b of the sealing agent 9 between the electronic part 2 and the wiring board 1, different lengths n of protrusion of the projection 11, different distances c between the tip end of the projection 11 and the connecting terminal 6, and different hardness of the sealing agent 9 and the conductive bonding material 12, were produced by a process similar to that described above. The variations in the thickness b of the sealing agent 9 and in the distance c were achieved by varying the pressure at the step (vii); the variation in length n of protrusion of the projection 11 was achieved by varying the conditions for forming the projection 11; and further, the variation in hardness of the sealing agent 9 and the conductive bonding material 12 was achieved by varying the amount of a hardening agent.

Then, the various connection units U1 were subjected to a thermal shock test. Test conditions are as follows: Each of the connection unit U1 was immersed in a silicone oil having a temperature of −40° C. for 5 minutes and then, in a silicone oil having a temperature of 120° C. for 5 minutes. This one cycle was repeated.

Table 2 shows the thickness b of the sealing agent 9, the diameter a of the projection 11, the distance c between the tip end of the projection 11 and the connecting terminal 6, the length n of protrusion of the projection 11, the thickness k of the connecting terminal 6, the hardness (HSD) of the sealing agent 9 and the conductive bonding material 12, and the estimation in the thermal shock test for the various connection units U1. In this estimation, a sign "O" indicates the fact that no abnormality was produced in the appearance of the sealing agent 9 after 5,000 cycles; a sign "α" indicates the fact that cracks were produced in a portion of the sealing agent 9 after 5,000 cycles; and a sign "X" indicates the fact that cracks were produced in the sealing agent 9 after 4,000 cycles. The example 3 in Table 1 is given as example 1 in Table 2.

6 and 7 also satisfy the condition that the hardness of the conductive bonding material 12 is lower than that of the sealing agent 9.

Each of the examples 3, 4 and 5 has a lower thermal shock resistance, because the relationship between the diameter a and the thickness h is b<a in the examples 3 and 5, and the distance c is smaller than 0.02 mm in the example 4. In the example 8, the thickness b of the sealing agent 9 and the distance c are out of the question, but the durability thereof is slightly low in the severe thermal shock test as described above, because the hardness of the conductive bonding material 12 is larger than that of the sealing agent 9.

PRODUCING EXAMPLE 2

(i) A transfer molding was carried out using a novolak-based epoxy resin containing a silica-based filler to form a skin film-shaped sealing agent 9 which was 11 mm long, 11 mm wide and 0.2 mm thick.

Figure 34:
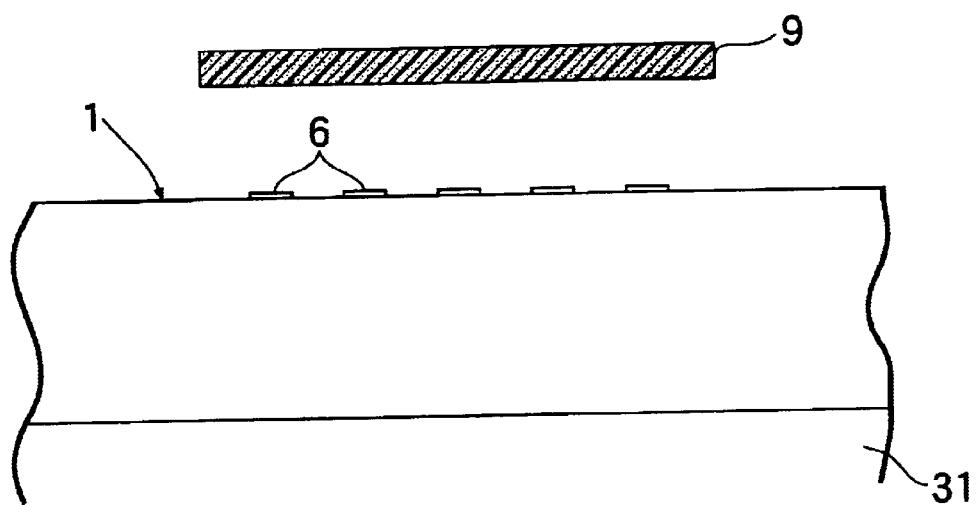
FIG. 34 is a partially broken-away front view of an essential portion, showing a state in which the skin film-shaped sealing agent has been disposed above the wiring board.

(ii) As shown in FIG. 34, a wiring board 1 was placed onto the heating plate 31 and heated to 120° C. and then, the sealing agent 9 was disposed above the wiring board 1, so that all the connecting terminals 6 were covered with the sealing agent 9.

Figure 35:
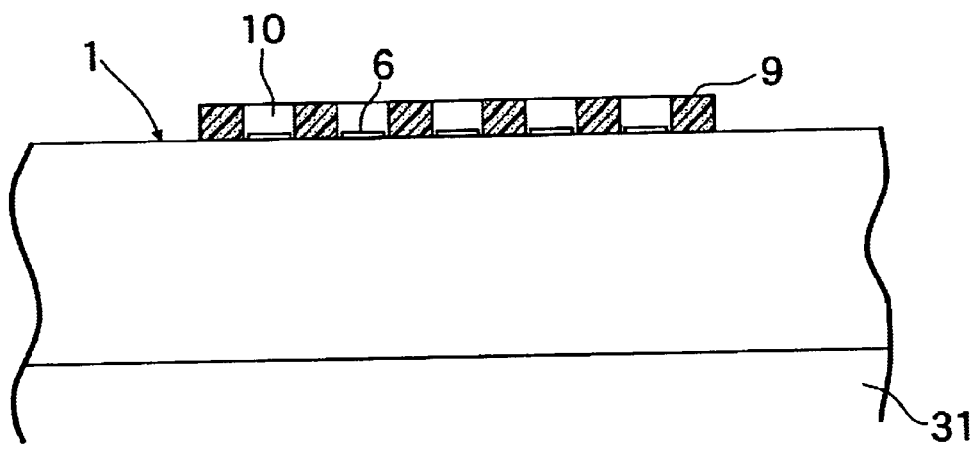
FIG. 35 is a partially broken-away front view of an essential portion, showing a state in which the skin film-shaped sealing agent has been superposed on the wiring board and a plurality of connecting bores have been formed in the sealing agent.

(iii) As shown in FIG. 35, the sealing agent 9 was superposed onto the wiring board 1 and then, pushed against the wiring board 1 for 10 seconds with a pressure of 80 gf/cm² for close adhesion by a temporary bonding. Thereafter, in correspondence to thirty-two electrodes 8 of an electronic part 2 and the same number of connecting terminals 6 of the wiring board 1 having the above-described structure, thirty-two connecting bores 10 each having a diameter g equal to 0.14 mm were formed in the sealing agent 9 by excimer laser.

Thereafter, the steps (v) to (viii) (see FIGS. 31 to 33) in "Producing Example 1" were sequentially carried out to produce a connection unit U1.

PRODUCING EXAMPLE 3

Figure 36:
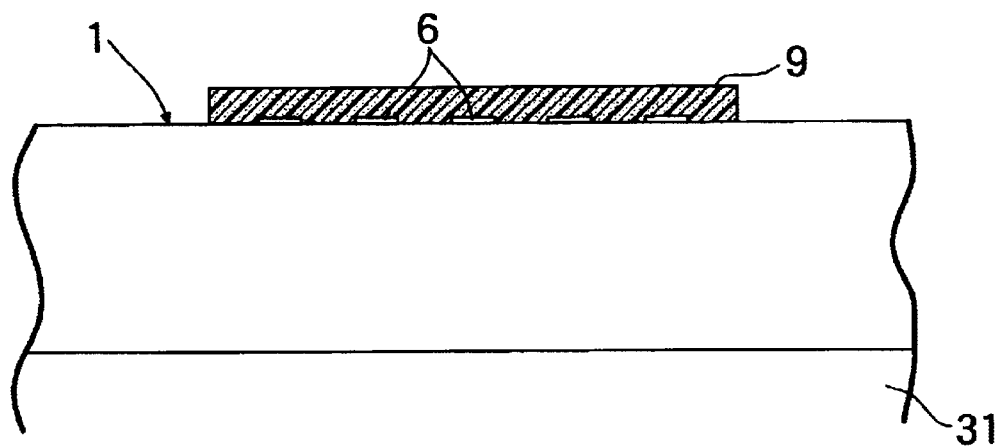
FIG. 36 is a partially broken-away front view of an essential portion, showing a state in which the skin film-shaped sealing agent has been superposed on the wiring board.

(i) As shown in FIG. 36, a wiring board 1 having thirty-two connecting terminals 6 on its surface was placed onto the

TABLE 2

| Connection unit | Thickness b (mm) of sealing agent | Projection | | | Thickness k (mm) of terminal | Hardness (HSD) | | Estimation |
| --- | --- | --- | --- | --- | --- | --- | --- | --- |
| | | Diameter a (mm) | Distance c (mm) | Length n (mm) of protrusion | | Sealing agent | Conductive bonding material | |
| Example 1 | 0.166 | 0.14 | 0.037 | 0.111 | 0.018 | 91 | 80 | O |
| Example 2 | 0.148 | | 0.020 | 0.110 | | | | O |
| Example 3 | 0.138 | | 0.014 | 0.106 | | | | X |
| Example 4 | 0.143 | | 0.017 | 0.108 | | | | X |
| Example 5 | 0.135 | | 0.027 | 0.090 | | | | X |
| Example 6 | 0.166 | | 0.038 | 0.110 | | | | O |
| Example 7 | 0.162 | | 0.038 | 0.106 | | 90 | 85 | O |
| Example 8 | 0.161 | | 0.037 | 0.106 | | 82 | 85 | Δ |

Table 2, when the diameter a of the projection 11 which is a constant value is defined as a criterion, if the thickness b of the sealing agent 9 is set in a range of b>a and the distance c between the tip end of the projection 11 and the connecting terminal 6 is set in a range of c>0.02 mm, the connection unit U1 exhibits an excellent durability even in the above-described severe thermal shock test, as in the examples 1, 2, 6 and 7. This is because the thermal stress due to the difference in linear expansion coefficient between the electronic part 2 and the wiring board 1 can be sufficiently moderated, because of the larger volume of the sealing agent 9 and the wider distance c. In this case, the examples 1, 2, heating plate 31. Then, the surface of the wiring board 1 was subjected to a screen printing using a liquid epoxy acrylate resin containing a multi-function acrylate monomer, which was an ultraviolet-curing resin, thereby forming a skin film-shaped sealing agent 9 and covering all the connecting terminals 6 with the sealing agent 9. This sealing agent 9 was 11 mm long, 11 mm wide and 0.2 mm thick in size.

Figure 37:
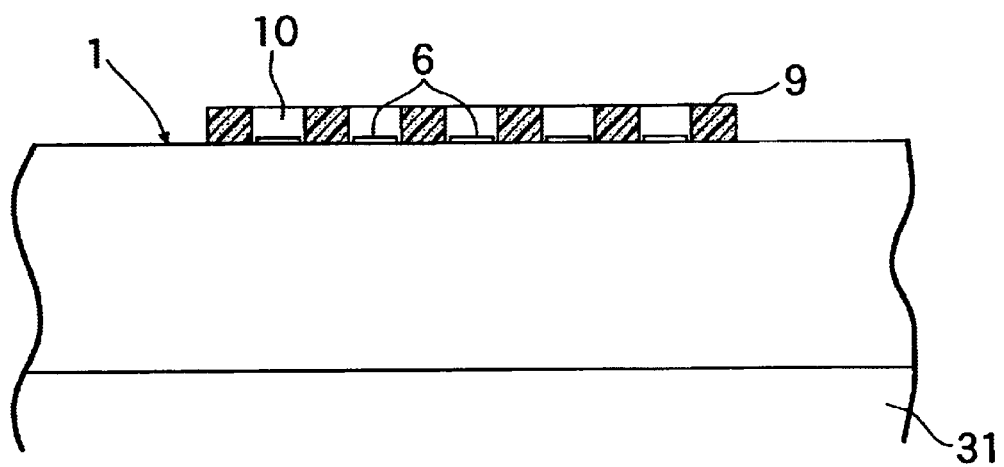
FIG. 37 is a partially broken-away front view of an essential portion, showing a state in which the plurality of connecting bores have been formed in the sealing agent.

(ii) As shown in FIG. 37, in order to form connecting bores 10 in those portions of the sealing agent 9 which correspond to the connecting terminals 6 on the wiring board 1, ultraviolet rays were applied to the remaining portion excluding the corresponding portions of the sealing agent 9 to cure the remaining portion. Thereafter, an uncured portion was removed by washing. The diameter g of each of the connecting bores 10 formed in the above manner was equal to 0.14 mm.

Figure 38:
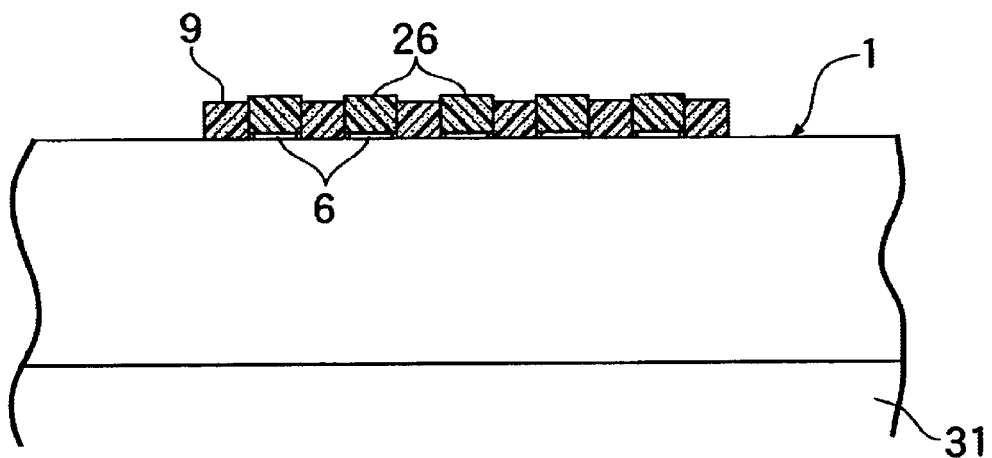
FIG. 38 is a partially broken-away front view of an essential portion, showing a state in which the first conductive paste has been filled into each of the connecting bores in the skin film-shaped sealing agent.

(iii) As shown in FIG. 38, the surface of the sealing agent 9 was subjected to a screen printing using the first conductive paste 26 having the above-described composition (the amount A of the solvent mixture was equal to 45.8% by volume) and the #200 mesh screen (the thickness of an emulsifying agent was of 10 µm), thereby filling the first conductive paste 26 into the connecting bores 10. In this case, the surface of the first conductive paste 26 was 0.1 mm higher in level than an opening edge of each of the connecting bores 10. Namely, the height m of the first conductive paste 26 was equal to 0.192 mm, as in Producing Example 1.

Figure 39:
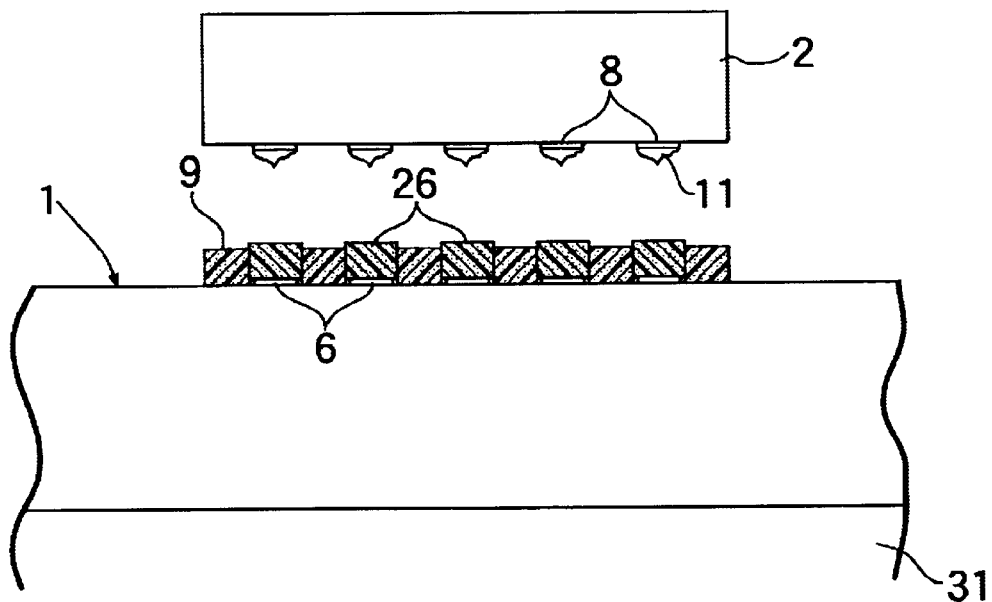
FIG. 39 is a partially broken-away front view of an essential portion, showing a state in which the electronic part has been disposed above the skin film-shaped sealing agent.

(iv) As shown in FIG. 39, the wiring board 1 was heated to 150° C. and then, the electronic part 2 was disposed above the sealing agent 9 with the electrodes 8 being matched with the connecting bores 10.

Figure 40:
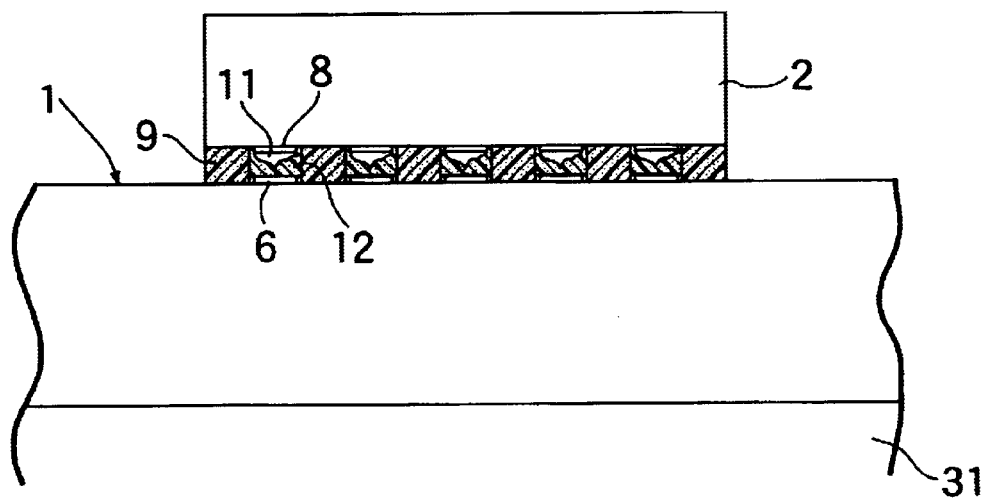
FIG. 40 is a partially broken-away front view of an essential portion, showing a state in which the electronic part has been bonded to the wiring board through the skin film-shaped sealing agent.

(v) As shown in FIG. 27, the diameter a of the projection 11 of each electrode 8 of the electronic part 2 was equal to 0.14 mm, and the length n of protrusion of the projection 11 was equal to 0.111 mm. As shown in FIG. 40, each of the projections 11 was put into the first conductive paste 26 in each of the connecting bores 10, whereby the electronic part 2 was superposed onto the sealing agent 9. Then, the electronic part 2 was pushed against the wiring board 1 for about 30 seconds with a pressure of 170 gf/cm² to cure the sealing agent 9 and the first conductive paste 26 and thus the conductive bonding material 12 under heating and pressurizing conditions, whereby the electronic part 2 was bonded to the wiring board 1.

(vi) To completely cure the sealing agent 9, the bonded electronic part 2 and wiring board 1 were placed into an oven, where they were maintained at 150° C. for 20 minutes under the atmospheric pressure and then cooled in the oven to produce a connection unit U1. Even in the connection unit U1, the hardness of the conductive bonding material 12 after being cured is lower than that of the sealing agent 9.

PRODUCING EXAMPLE 4

The electronic part 2 cannot be bonded to the wiring board 1 in some cases, depending upon the material of the sealing agent 9. In such a case, the following mounting process is carried out.

Figure 41:
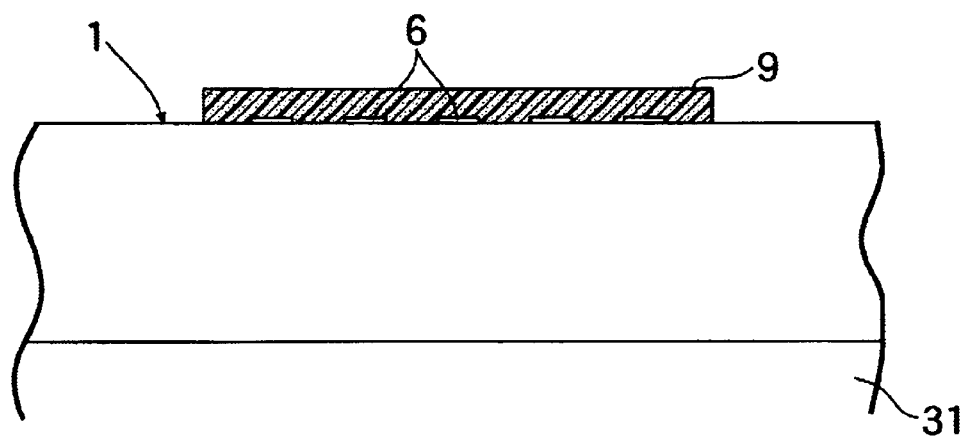
FIG. 41 is a partially broken-away front view of an essential portion, showing a state in which the skin film-shaped sealing agent has been superposed on the wiring board.

(i) As shown in FIG. 41, a wiring board 1 having thirty-two connecting terminals 6 on its surface was placed onto the heating plate 31. Then, the surface of the wiring board 1 was subjected to a screen printing using a liquid polyester acrylate resin containing a multi-function acrylate monomer, which was an ultraviolet-curing resin, thereby forming a skin film-shaped sealing agent 9 and covering all the connecting terminals 6 with the sealing agent 9. This sealing agent 9 was 11 mm long, 11 mm wide and 0.2 mm thick in size.

Figure 42:
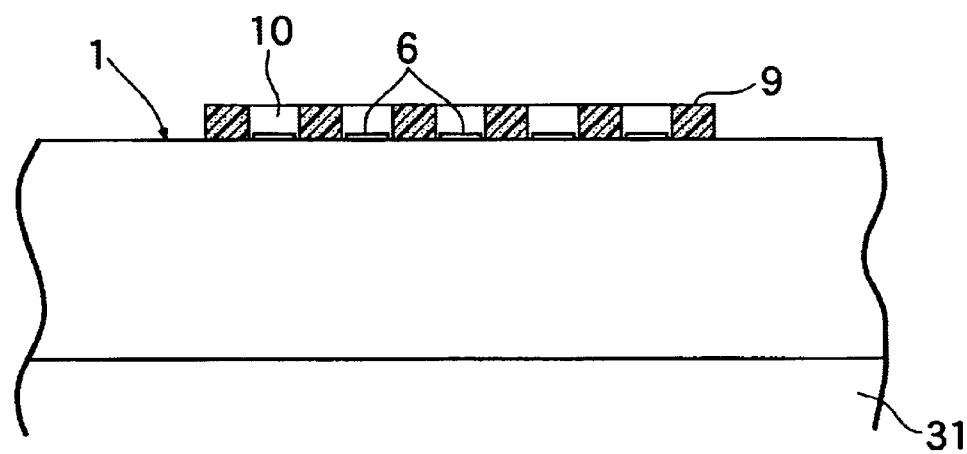
FIG. 42 is a partially broken-away front view of an essential portion, showing a state in which a plurality of connecting bores have been formed in the sealing agent.

(ii) As shown in FIG. 42, in order to form connecting bores 10 in those portions of the sealing agent 9 which correspond to the connecting terminals 6 on the wiring board 1, ultraviolet rays were applied to the remaining portion excluding the corresponding portions of the sealing agent 9 to cure the remaining portion. Thereafter, an uncured portion was removed by washing. The diameter g of each of the connecting bores 10 formed in the above manner was equal to 0.14 mm.

Figure 43:
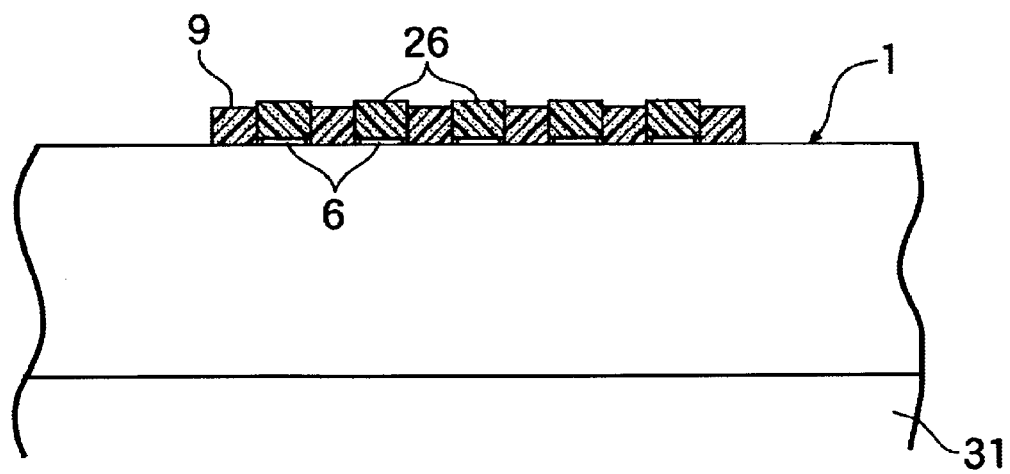
FIG. 43 is a partially broken-away front view of an essential portion, showing a state in which the first conductive paste has been filled into each of the connecting bores in the skin film-shaped sealing agent.

(iii) As shown in FIG. 43, the surface of the sealing agent 9 was subjected to a screen printing using the first conductive paste 26 having the above-described composition (the amount A of the solvent mixture was equal to 45.8% by volume) and the #200 mesh screen (the thickness of an emulsifying agent was of 10 µm), thereby filling the first conductive paste 26 into the connecting bores 10. In this case, the surface of the first conductive paste 26 was 0.1 mm higher in level than an opening edge of each of the connecting bores 10. Namely, the height m of the first conductive paste 26 was equal to 0.192 mm, as in Producing Example 1.

Figure 44:
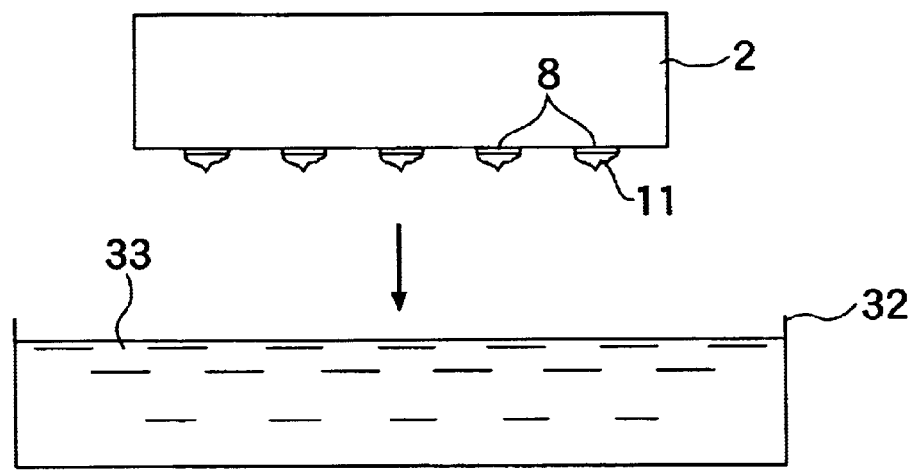
FIG. 44 is a partially broken-away front view, showing a state in which an adhesive is to be applied to the electronic part.

(iv) As shown in FIG. 44, a liquid epoxy resin 33 having a viscosity as low as 50 cP and a high bonding force was prepared in a container 32. That surface of an electronic part 2 which has electrodes 8 was brought into contact with the resin 33, whereby the resin 33 was applied extremely thinly to such surface.

Figure 45:
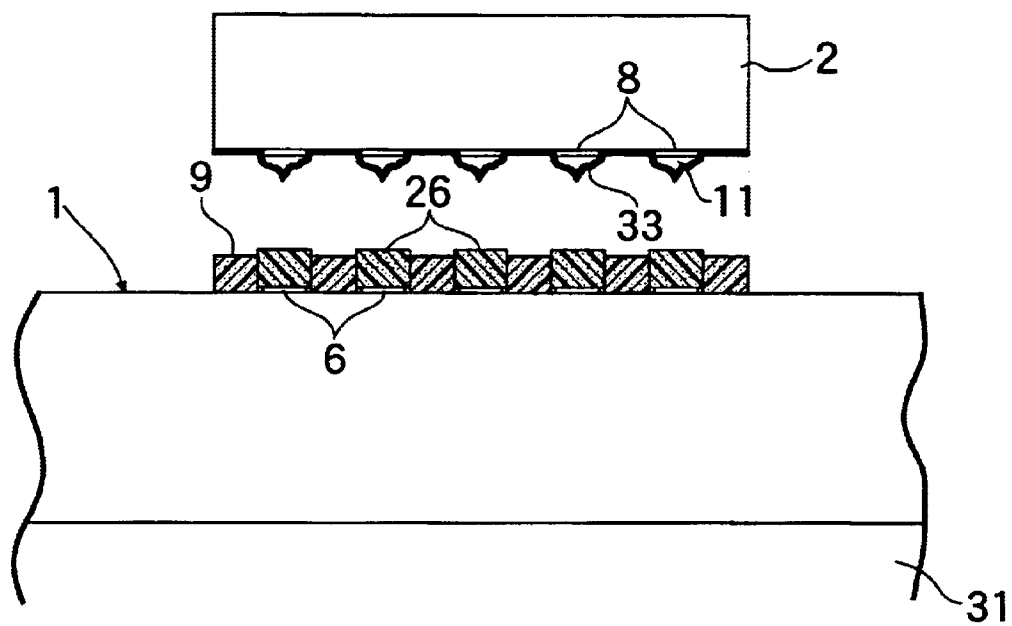
FIG. 45 is a partially broken-away front view of an essential portion, showing a state in which the electronic part has been disposed above the skin film-shaped sealing agent.

(v) As shown in FIG. 45, the wiring board 1 was heated to 150° C. and then, the electronic part 2 was disposed above the sealing agent 9 with the electrodes 8 being matched with the connecting bores 10.

Figure 46:
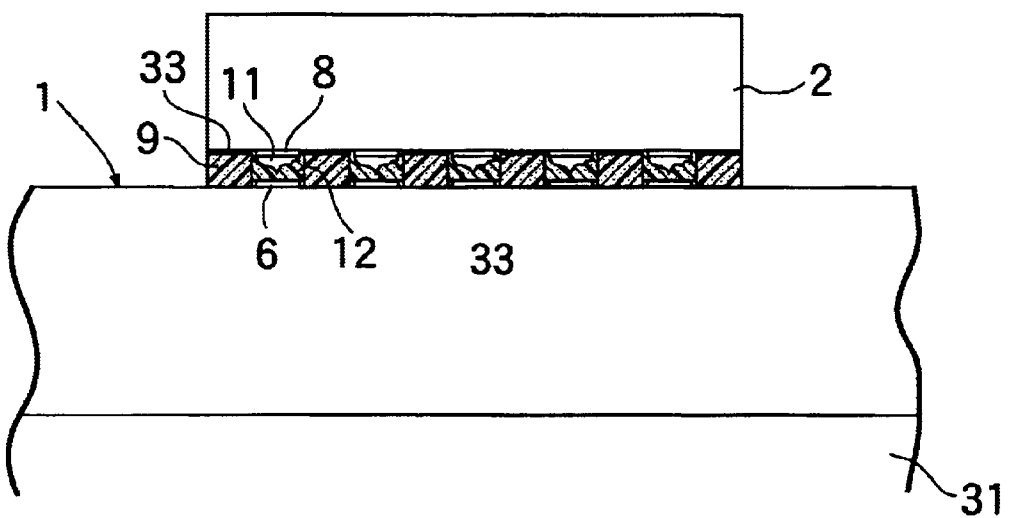
FIG. 46 is a partially broken-away front view of an essential portion, showing a state in which the electronic part has been bonded to the wiring board through the skin film-shaped sealing agent.

(vi) As shown in FIG. 27, the diameter a of the projection 11 of each electrode 8 of the electronic part 2 was equal to 0.14 mm, and the length n of protrusion of the projection 11 was equal to 0.111 mm. As shown in FIG. 46, each of the projections 11 was put into the first conductive paste 26 in each of the connecting bores 10, whereby the electronic part 2 was superposed onto the sealing agent 9. The high-bonding force epoxy resin 33 adhered to the surface of the projection 11 was stroked by the first conductive paste 26 during putting the projections 11 into the first conductive paste 26 and thus removed from the surface of the projection 11. Then, the electronic part 2 was pushed against the wiring board 1 for about 90 seconds with a pressure of 100 gf/cm² to cure the sealing agent 9 and the first conductive paste 26 and thus the conductive bonding material 12 and the high-bonding force liquid epoxy resin 33 under heating and pressurizing conditions, whereby the electronic part 2 was bonded to the wiring board 1.

(vii) To completely cure the sealing agent 9, the bonded electronic part 2 and wiring board 1 were placed into an oven, where they were maintained at 150° C. for 60 minutes under the atmospheric pressure and then cooled in the oven to produce a connection unit U1.

The high-bonding force epoxy resin 33 may be applied to the surface of the sealing agent 9 by a screen printing in place of being applied to the electronic part 2. In this case, the film thickness of the resin 33 is suitable to be of 5 µm.

What is claimed is:

1. A plug-in type electronic control unit, comprising a wiring board, a plurality of electronic parts mounted on one of opposite surfaces of said wiring board by utilizing a wireless bonding process, and a plug member mounted on the other surface of said wiring board by utilizing a wireless bonding process;

wherein said electronic control unit has a connection structure comprising a connecting terminal of said wiring board, a pin-shaped contact of said plug member which is opposed to said connecting terminal, a conductive bonding material which electrically connects said connecting terminal and said pin-shaped contact to each other, and an electric insulator surrounding said conductive bonding material and sandwiched between said wiring board and said plug member; and wherein the relationship between a diameter d of said pin-shaped contact and a thickness e of said electric insulator is set at e>d, and a distance f between a tip end of said pin-shaped contact and said connecting terminal is set in a range of f>0.02 mm.

2. A plug-in type electronic control unit according to claim 1, wherein the hardness of said conductive bonding material in a cured state is lower than the hardness of said electric insulator.

3. A structure of connection of a wiring board with a plug member, comprising a wiring board having an electronic part mounted on one of opposite surfaces thereof and a connecting terminal on the other surface thereof, a plug member including a pin-shaped contact opposed to said connecting terminal, a conductive bonding material which electrically connects said connecting terminal and said pin-shaped contact to each other, and an electric insulator which surrounds said conductive bonding material and is sandwiched between said wiring board and said plug member;

wherein the relationship between a diameter d of said pin-shaped contact and a thickness e of said electric insulator is set at e>d, and a distance f between a tip end of said pin-shaped contact and said connecting terminal is set in a range of f>0.02 mm.

4. A structure of connection of a wiring board with a plug member according to claim 3, wherein the hardness of said conductive bonding material in a cured state is lower than the hardness of said electric insulator.

5. A unit of connection of an electronic part with a wiring board, comprising an electronic part provided with at least one electrode having a projection, a wiring board including at least one connecting terminal opposed to said projection, a conductive bonding material which electrically connects said projection and said connecting terminal to each other, and an electrically insulating sealing agent which surrounds said conductive bonding material and bonds said electronic part and said wiring board to each other, the relationship between a diameter a of said projection and a thickness b of said sealing agent existing between said electronic part and said wiring board being set at b>a, and a distance c between a tip end of said projection and said connecting terminal being set in a range of c>0.02 mm.

6. A unit of connection of an electronic part with a wiring board, comprising an electronic part provided with at least one electrode having a projection, a wiring board including at least one connecting terminal opposed to said projection, a conductive bonding material which electrically connects said projection and said connecting terminal to each other, an electrically insulating sealing agent which surrounds said conductive bonding material and which is bonded to said wiring board, and an adhesive which bonds said electronic part and said sealing agent to each other, the relationship between a diameter a of said projection and a thickness b of said sealing agent existing between said electronic part and said wiring board being set at b>a, and a distance c between a tip end of said projection and said connecting terminal being set in a range of c>0.02 mm.

7. A unit of connection of an electronic part with a wiring board according to claim 5 or 6, wherein the hardness of said conductive bonding material in a cured state is lower than the hardness of said sealing agent.

8. A plug-in type electronic control unit comprising a wiring board, a plurality of electronic parts mounted on one of opposite surfaces of said wiring board by utilizing a wireless bonding process, and a plug member mounted on the other surface of said wiring board by utilizing a wireless bonding process;

wherein said electronic control unit has a connection structure comprising a connecting terminal of said wiring board, a pin-shaped contact of said plug member which is opposed to said connecting terminal, a conductive bonding material which electrically connects said connecting terminal and said pin-shaped contact to each other, an electric insulator surrounding said conductive bonding material and sandwiched between said wiring board and said plug member; and wherein the hardness of said conductive bonding material in a cured state is lower than the hardness of said electric insulator.

9. A structure of connection of a wring board with a plug member, comprising a wiring board having an electronic part mounted on one of opposite surfaces thereof and a connecting terminal on the other surface thereof, a plug member including a pin-shaped contact opposed to said connecting terminal, a conductive bonding material which electrically connects said connecting terminal and said pin-shaped contact to each other, and an electric insulator which surrounds said conductive bonding material and is sandwiched between said wiring board and said plug member;

wherein the hardness of said conductive bonding material in a cured state is lower than the hardness of said electric insulator.

10. A process for mounting an electronic part having at least one electrode onto a heat resistant and electrically insulating wiring board having at least one connecting terminal, while connecting said electrode electrically to said connecting terminal, said process comprising the steps of bringing an electrically insulating skin film-shaped sealing agent into close contact with said wiring board, filling a conductive bonding material into at least one connecting bore in the skin film-shaped sealing agent which corresponds to said connecting terminal, and bonding said electronic part to said wiring board through said skin film-shaped sealing agent in a state in which a projection of said electrode of said electronic part has been put into said conductive bonding material in said connecting bore;

wherein said skin film-shaped sealing agent and said conductive bonding material are cured at said bonding step, and the hardness of said conductive bonding material is lower than the hardness of said sealing agent.

11. A process for mounting an electronic part according to claim 10, wherein said skin film-shaped sealing agent and said conductive bonding material are thermally curable, and the time for gelling of said conductive bonding material under heating is shorter than the time for gelling of said skin film-shaped sealing agent.

12. A process for mounting an electronic part having at least one electrode onto a heat resistant and electrically insulating wiring board having at least one connecting terminal, while connecting said electrode electrically to said connecting terminal, said process comprising the steps of bringing an electrically insulating skin film-shaped sealing agent into close contact with said wiring board, filling a conductive bonding material into at least one connecting bore in the skin film-shaped sealing agent which corresponds to said connecting terminal, and bonding said electronic part to said wiring board through an electrically insulating adhesive and said skin film-shaped sealing agent in a state in which a projection of said electrode of said electronic part has been put into said conductive bonding material in said connecting bore;

wherein said skin film-shaped sealing agent and said conductive bonding material are cured at said bonding step, and the hardness of said conductive bonding material is lower than the hardness of said sealing agent.

13. A process for mounting an electronic part according to claim 12, wherein said skin film-shaped sealing agent and said conductive bonding material are thermally curable, and the time for gelling of said conductive bonding material under heating is shorter than the time for gelling of said skin film-shaped sealing agent.

* * * * *